US009779986B2

(12) United States Patent
Harikai et al.

(10) Patent No.: US 9,779,986 B2
(45) Date of Patent: Oct. 3, 2017

(54) PLASMA TREATMENT METHOD AND METHOD OF MANUFACTURING ELECTRONIC COMPONENT

(71) Applicant: Panasonic Intellectual Property Management Co., Ltd., Osaka (JP)

(72) Inventors: Atsushi Harikai, Osaka (JP); Noriyuki Matsubara, Osaka (JP); Hideo Kanou, Osaka (JP); Mitsuru Hiroshima, Osaka (JP); Syouzou Watanabe, Osaka (JP); Toshihiro Wada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/245,139

(22) Filed: Aug. 23, 2016

(65) Prior Publication Data
US 2017/0069536 A1    Mar. 9, 2017

(30) Foreign Application Priority Data

Sep. 7, 2015  (JP) ................. 2015-175747
Sep. 7, 2015  (JP) ................. 2015-175748

(51) Int. Cl.
*H01L 21/78*    (2006.01)
*H01L 21/3065*  (2006.01)
*H01L 21/308*   (2006.01)
*H01L 21/768*   (2006.01)

(52) U.S. Cl.
CPC .............. *H01L 21/76826* (2013.01)

(58) Field of Classification Search
CPC .................................. H01L 21/76826
See application file for complete search history.

(56) References Cited

U.S. PATENT DOCUMENTS

| 2010/0216313 | A1 | 8/2010 | Iwai |
| 2013/0065378 | A1 | 3/2013 | Johnson et al. |
| 2013/0295775 | A1 | 11/2013 | Iwai |

FOREIGN PATENT DOCUMENTS

| JP | 2009-094436 | 4/2009 |
| JP | 2014-513868 | 6/2014 |
| WO | 2012/125560 | 9/2012 |

*Primary Examiner* — Nadine Norton
*Assistant Examiner* — Mahmoud Dahimene
(74) *Attorney, Agent, or Firm* — Pearne & Gordon LLP

(57) ABSTRACT

Provided is a plasma treatment method including: placing a substrate carrier holding a substrate on a stage; adjusting a distance between a cover and the stage to a first distance in which the cover covers a frame without coming into contact with the substrate carrier; performing a plasma treatment on the substrate placed on the stage after the adjusting of the distance; carrying the substrate together with the substrate carrier out from a reaction chamber after the performing of the plasma treatment; and removing an adhered substance adhered to the cover by generating plasma in the inside of the reaction chamber after the carrying of the substrate, in which the distance between the cover and the stage in the removing of the adhered substance is a second distance greater than the first distance.

16 Claims, 16 Drawing Sheets

PLASMA TREATMENT METHOD AND METHOD OF MANUFACTURING ELECTRONIC COMPONENT

BACKGROUND

1. Technical Field

The present disclosure relates to a plasma treatment method and a method of manufacturing an electronic component, and particularly relates to a plasma treatment method using a plasma treatment device including a cover over a stage.

Further, the present disclosure relates to a plasma treatment method and a method of manufacturing an electronic component, and particularly relates to improvement of productivity in a case where an electronic component is manufactured by performing a plasma treatment on a substrate held by a resin sheet.

2. Description of the Related Art

As a method of dicing a substrate, a plasma dicing method in which a substrate on which a resist mask is formed is subjected to plasma etching and divided into individual chips is known. Japanese Patent Unexamined Publication No. 2009-94436 and PCT Japanese Translation Patent Publication No. 2014-513868 disclose that a substrate is held by a substrate carrier including a ring-like frame and a resin sheet which covers an opening portion of the frame in order to improve handleability of the substrate during conveyance or the like. The substrate is placed on a stage in a state of being held by the substrate carrier and is subjected to a plasma treatment.

In this case, when the substrate carrier is directly exposed to plasma, a holding sheet formed of a resin material and an adhesive used to fix the holding sheet to the frame are heated. There is a concern that the substrate carrier is damaged, for example, the heating leads to elongation (deformation) of the holding sheet or degradation of adhesiveness of the adhesive and thus the holding sheet is peeled off from the frame.

Therefore, in Japanese Patent Unexamined Publication No. 2009-94436, a dielectric cover having a window portion is disposed over a stage in the inside of a reaction chamber of a plasma treatment device. The cover includes a main body portion used to cover the frame and a window portion formed to pass through the main body portion in the thickness direction. During the plasma treatment, the main body portion covers the frame and the holding sheet so that these are not exposed to plasma, and the substrate is exposed by the window portion. A portion, on which a resist mask is not formed, in the exposed substrate is etched by plasma.

The resin sheet is adsorbed by the stage typically due to an electrostatic adsorption mechanism referred to as an electrostatic chuck. The electrostatic adsorption mechanism includes an electrode for electrostatic adsorption (electrostatic chunk) (hereinafter, referred to as an ESC electrode) disposed in the inside of the stage. When a voltage is applied to the ESC electrode, Coulomb force is generated in a space between the ESC electrode and the substrate carrier and Johnsen-Rahbek force is generated in a space between the stage and the substrate carrier. The electrostatic adsorption mechanism allows the stage to adsorb the resin sheet using the above-described electrostatic force.

In a plasma treatment process, in order to perform vertical etching on the surface of a substrate, an etching step using plasma of fluorine-based gas such as $SF_6$ and a protective film deposition step using plasma of fluorocarbon gas such as perfluorocyclobutane (CFO are alternately repeated in some cases.

When the plasma treatment is continuously performed on a plurality of substrates using such a method, adhesive materials are accumulated in the reaction chamber as the number of treated substrates is increased, and thus the substrates are contaminated or desired etching cannot be carried out in some cases.

An adhesive material is, for example, a substance containing carbon and is adhered to a surface (hereinafter, referred to as a rear surface of the cover) facing a stage of a cover. The substance is a reaction product derived from fluorocarbon gas used in the above-described protective film deposition step. During the plasma treatment, since the cover protects a frame and a holding sheet from plasma, the cover is disposed in a position which is not in contact with the frame and the holding sheet and is as close to the frame and the holding sheet as possible.

In the protective film deposition step, the fluorocarbon gas introduced to the reaction chamber is decomposed to ions or radicals in the plasma, and some of these enter a space between the cover and the stage and are brought into contact with the rear surface of the cover. In this manner, a reaction product containing carbon derived from the fluorocarbon gas is adhered to the rear surface of the cover.

In the etching step, the fluorine-based gas introduced to the reaction chamber is decomposed to ions or radicals in the plasma, and some of these enter the space between the cover and the stage in the same manner as described above. In the etching step, a bias voltage is typically applied to the stage. In this manner, the speed at the time of a decomposition component of the fluorine-based gas colliding with the substrate placed on the stage is increased and thus the etching reaction is promoted. However, since the rear surface of the cover is positioned over the stage in a state of being separated from the stage, the effect for promoting the etching reaction with respect to the rear surface of the cover is unlikely to be obtained even when a bias voltage is applied to the stage. Therefore, the decomposition component of the fluorine-based gas having entered the space between the cover and the stage is unable to sufficiently remove the reaction product adhered to the rear surface of the cover in the protective film deposition step. As a result, the reaction product is accumulated on the rear surface of the cover whenever the plasma treatment process is repeated. The accumulated reaction product is eventually peeled off from the rear surface of the cover and then falls onto the stage or the substrate or is suspended in the reaction chamber. Therefore, the substrate is contaminated or desired etching cannot be carried out.

In a case where the plasma treatment is continuously performed on a plurality of substrates respectively held by a resin sheet, there is a tendency that the depth (etching rate) obtained from the etching within a predetermined time is decreased as the number of treated substrates is increased. Further, an adhesive matter is generated on the stage after the plasma treatment is performed on the substrates respectively held by a resin sheet such that the shape of a resin sheet is transferred. It is understood that a decrease in etching rate is affected by the adhesive matter.

During the plasma treatment, heat generated by irradiation with plasma or an electric field and a leakage current generated by the ESC electrode are added to the resin sheet. Accordingly, it is considered that various additives such as a plasticizer contained in the resin sheet are discharged from the resin sheet, suspended on the surface of the resin sheet, and adhered to the stage during the plasma treatment. A large amount of adhesive matter, resulting from the resin sheet, is generated particularly from a portion of the resin sheet holding the substrate. As described above, a phenomenon in which various additives contained in the resin are suspended on the surface of the resin is referred to as bleed-out.

Here, the stage is typically cooled (for example, 15° C. or lower) in order to suppress thermal damage to the resin sheet by being heated through irradiation with plasma. When the stage is cooled, the resin sheet in close contact with the stage is also cooled by electrostatic adsorption. However, when an adhesive matter is interposed between the resin sheet and the stage, the effect for cooling the resin sheet is decreased. When the resin sheet is not sufficiently cooled, the effect for cooling the substrate held by the resin sheet is also decreased. Therefore, the etching rate is reduced and then the productivity is decreased. In a case where a substrate is continuously treated, since it is necessary to stop a process for removal of an adhesive matter of the stage, the productivity is further decreased.

SUMMARY

According to a first aspect of the present disclosure, there is provided a plasma treatment method. The plasma treatment method places a substrate held by a substrate carrier that includes a holding sheet and a frame disposed on the outer peripheral portion of the holding sheet, on a stage provided in the inside of a reaction chamber, and covers the frame with a cover that is disposed over the stage and includes a window portion for exposing the substrate, to perform a plasma treatment on the substrate. The plasma treatment method includes the following process. That is, the process includes placing the substrate carrier holding the substrate on the stage; adjusting the distance between the cover and the stage to a first distance in which the cover covers the frame without coming into contact with the substrate carrier; performing the plasma treatment on the substrate placed on the stage after the adjusting of the distance; carrying the substrate together with the substrate carrier out from the reaction chamber after the performing of the plasma treatment; and removing an adhered substance adhered to the cover by generating plasma in the inside of the reaction chamber after the carrying of the substrate, in which the distance between the cover and the stage in the removing of the adhered substance is a second distance greater than the first distance.

According to another aspect of the present disclosure, there is provided a method of manufacturing an electronic component. A method of manufacturing an electronic component places a substrate held by a substrate carrier that includes a holding sheet and a frame disposed on the outer peripheral portion of the holding sheet, on a stage provided in the inside of a reaction chamber, and covers the frame with a cover that is disposed over the stage and includes a window portion for exposing the substrate, to perform a plasma treatment on the substrate. The method for manufacturing an electronic component includes the following process. That is, the process includes preparing the substrate held by the substrate carrier that includes the holding sheet and the frame disposed on the outer peripheral portion of the holding sheet; placing the substrate carrier holding the substrate on the stage; adjusting the distance between the cover and the stage to a first distance in which the cover covers the frame without coming into contact with the substrate carrier; singulating the substrate by performing the plasma treatment on the substrate placed on the stage after the adjusting of the distance; carrying the singulated substrate together with the substrate carrier out from the reaction chamber after the singulating; and removing an adhered substance adhered to the cover by generating plasma in the inside of the reaction chamber after the carrying of the substrate, in which the distance between the cover and the stage in the removing of the adhered substance is a second distance greater than the first distance.

According to still another aspect of the present disclosure, there is provided a plasma treatment method in which a plasma treatment is performed by placing a substrate held by a resin sheet on a stage provided in the inside of a reaction chamber. The plasma treatment method includes placing the substrate on the stage such that the surface of the stage comes into contact with the resin sheet; performing the plasma treatment on the substrate placed on the stage; carrying the substrate together with the resin sheet out from the reaction chamber after the performing of the plasma treatment; and removing a substance discharged from the resin sheet and adhered to the surface of the stage by generating plasma in the reaction chamber after the carrying of the substrate.

According to still another aspect of the present disclosure, there is provided a method of manufacturing an electronic component including: preparing a substrate held by a resin sheet; placing the substrate on a stage such that the surface of the stage provided in the inside of a reaction chamber comes into contact with the resin sheet; singulating the substrate by performing the plasma treatment on the substrate placed on the stage; carrying the substrate together with the resin sheet out from the reaction chamber after the singulating; and removing a substance discharged from the resin sheet and adhered to the surface of the stage by generating plasma in the inside of the reaction chamber after the carrying of the substrate.

According to the present disclosure, since an adhesive matter adhered to the rear surface of the cover can be removed, the yield of an electronic component is improved.

Further, according to the present disclosure, since the etching rate is high and stable, the productivity is improved. Even in a case where the substrate is continuously treated, since an adhesive matter can be removed without stopping a process, the productivity is further improved.

DETAILED DESCRIPTION

Figure 1:
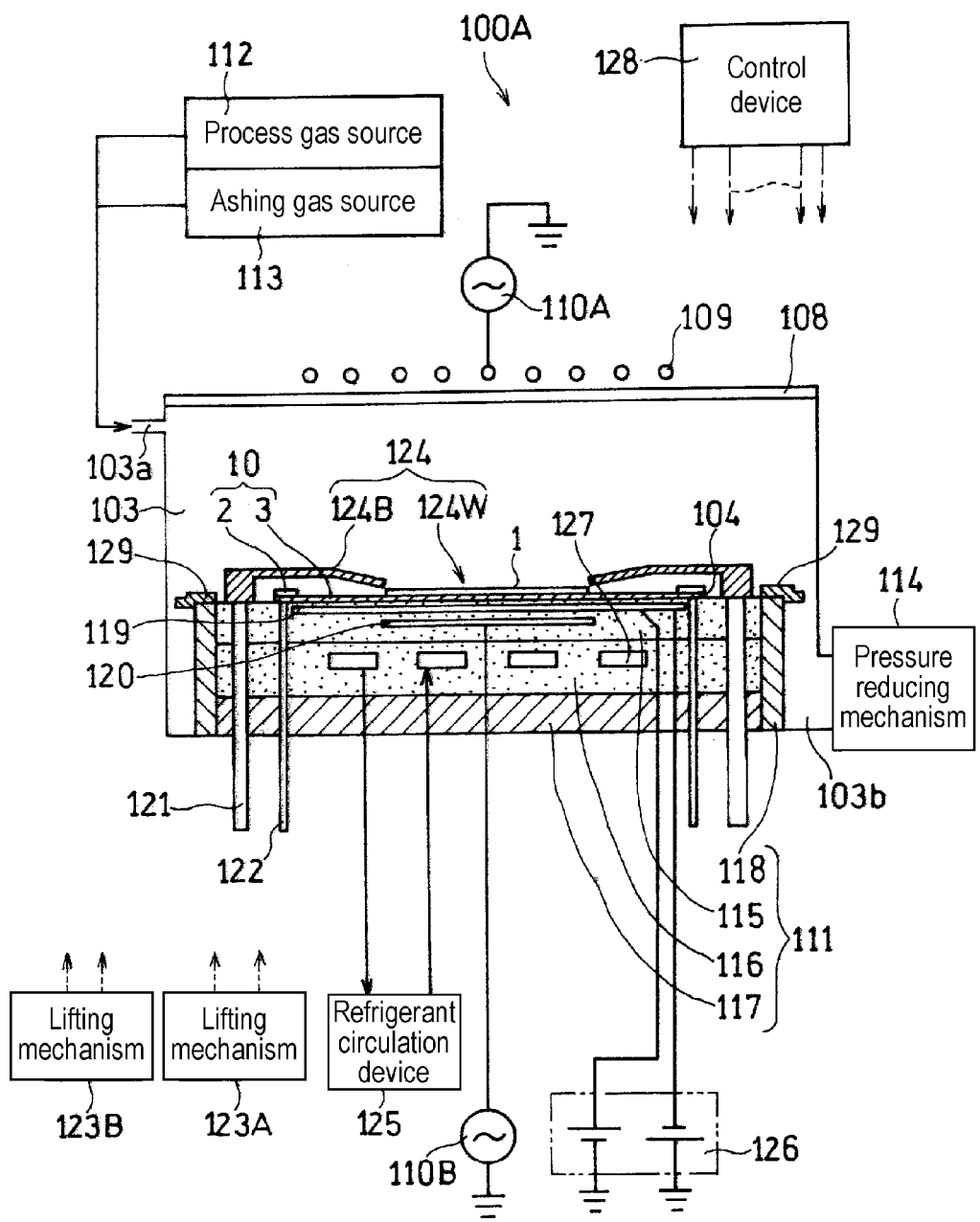
FIG. 1 is a sectional view schematically illustrating an example of a plasma treatment device according to the present disclosure.

A first plasma treatment method according to the present disclosure is a plasma treatment method in which a substrate is subjected to a plasma treatment by placing the substrate, held by a substrate carrier that includes a holding sheet and a frame disposed on the outer peripheral portion of the holding sheet, on a stage provided in the inside of a reaction chamber and covering the frame with a cover that is disposed over the stage and includes a window portion for exposing the substrate. That is, the plasma treatment method includes a placing process of placing the substrate carrier holding the substrate on the stage and a distance adjustment process of adjusting the distance between the cover and the stage to a first distance in which the cover covers the frame without coming into contact with the substrate carrier. The plasma treatment method further includes a plasma treatment process of performing the plasma treatment on the substrate placed on the stage after the distance adjustment process, a carrying-out process of carrying the substrate together with the substrate carrier out from the reaction chamber after the plasma treatment process, and a removal process of removing an adhered substance adhered to the cover by generating plasma in the inside of the reaction chamber after the carrying-out process. The distance between the cover and the stage during the removal process (second distance d2) is set to be greater than the distance between the cover and the stage during the plasma treatment (first distance d1). In this manner, since the plasma can enter the rear surface of the cover, an adhesive matter adhered to the rear surface of the cover is removed.

A first method of manufacturing an electronic component is a method of dicing a substrate using the first plasma treatment method. The method of manufacturing an electronic component includes a preparation process of preparing the substrate held by a substrate carrier including a holding sheet and a frame disposed on the outer peripheral portion of the holding sheet, a placing process of placing the substrate carrier holding the substrate on the stage, a distance adjustment process of adjusting the distance between the cover and the stage to a first distance in which the cover covers the frame without coming into contact with the substrate carrier, a dicing process of singulating the substrate by performing the plasma treatment on the substrate placed on the stage after the distance adjustment process, a carrying-out process of carrying the singulated substrate together with the substrate carrier out from the reaction chamber after the dicing process, and a removal process of removing an adhesive matter adhered to the cover by generating plasma in the inside of the reaction chamber after the carrying-out process.

As described above, since an adhesive matter adhered to the rear surface of the cover can be removed, the yield of the electronic component is improved.

A second plasma treatment method includes a placing process of placing the substrate held by the resin sheet on the stage such that the surface of the stage included in the plasma treatment device comes into contact with the resin sheet, a plasma treatment process of performing the plasma treatment on the substrate placed on the stage; and a carrying-out process of carrying the substrate together with the resin sheet out from the reaction chamber after the plasma treatment process. After the carrying-out process, plasma is generated again in the reaction chamber which does not have substrate carrier 10. In this manner, a substance (adhesive matter) bled out from the resin sheet and adhered to the surface of the stage can be removed. Therefore, an effect for cooling the substrate to be placed on the stage next is unlikely to be damaged. Accordingly, high power can be supplied to the inside of the reaction chamber and the etching rate (plasma dicing speed in a case where the substrate is diced by the plasma treatment) can be increased. As a result, the time required for the plasma treatment (for example, dicing) becomes shortened and thus the productivity is improved. Further, in a case where adhesive matters are adhered in a non-uniform manner, the temperature of the substrate to be placed on the stage next is not occasionally uniform in the surface of the substrate. In this case, in-plane distribution of etching with respect to the substrate becomes non-uniform and then unevenness in processing shape may occur. In other words, a decrease in yield due to an adhesive matter on the stage can be suppressed by including the removal process.

A trace amount of components (bleed-out components) bled out from the resin sheet during the plasma treatment are interposed between the resin sheet and the stage such that a small gap therebetween is filled with the components so that the adhesiveness (adsorptivity) of the resin sheet or the substrate to the stage is improved or thermal conductivity between the resin sheet and the stage is improved in some cases. In other words, the plasma treatment process in the plasma treatment method may be a process of performing the plasma treatment on the substrate placed on the stage in a state in which the resin sheet is electrostatically adsorbed on the surface of the stage and interposing a trace amount of bleed-out components included in the resin sheet between the resin sheet and the stage. In this manner, etching on the substrate may be easily and more uniformly performed. Moreover, the above-described effect from the bleed-out components can be seen in a case where the amount of the bleed-out components is small.

It is preferable that the removal process is performed in an oxygen atmosphere. In other words, it is preferable that an adhesive matter is removed by oxygen plasma from the viewpoint that an adhesive matter can be more efficiently removed. Particularly an organic matter is efficiently removed by the oxygen plasma. The oxygen atmosphere indicates an atmosphere in which the content of oxygen with respect to the entire gas included in the reaction chamber is in a range of 50% by volume to 100% by volume (the same applies to hereinafter). From the viewpoint of the removal efficiency, the content of oxygen is preferably in a range of 80% by volume to 100% by volume.

A second method of manufacturing an electronic component is a method of dicing the substrate using the second plasma treatment method. That is, the method of manufacturing an electronic component includes a process of preparing a substrate held by a resin sheet, the placing process, a dicing process of singulating the substrate using the plasma treatment, the carrying-out process, and the removal process in this order. As described above, since the efficiency of the plasma treatment is improved by performing the removal process, the productivity of the electronic component is improved.

Hereinafter, embodiments will be described in detail with reference to the accompanying drawings.

First Embodiment

A first embodiment relates to the first plasma treatment method and the first method of manufacturing an electronic component. The embodiment of the plasma treatment device will be described in detail with reference to FIG. 1. FIG. 1 is a view schematically illustrating the section of the plasma treatment device. In the plasma treatment device illustrated in FIG. 1, the distance between the cover and the stage is changed by lifting and lowering the cover.

Plasma treatment device 100A includes stage 111. Main body portion 124B that covers at least a part of frame 2 and holding sheet 3; and cover 124 that includes window portion 124W for exposing at least a part of substrate 1 are disposed over stage 111. Window portion 124W is formed of an opening penetrating main body portion 124B in the thickness direction thereof.

Stage 111 and cover 124 are disposed in reaction chamber (vacuum chamber) 103. Reaction chamber 103 has a substantially cylindrical shape with an open upper portion and the opening of the upper portion is closed by dielectric member 108 serving as a lid. Examples of the material constituting reaction chamber 103 include aluminum, stainless steel (SUS), and aluminum whose surface is alumite-processed. Examples of the material constituting dielectric member 108 include dielectric materials such as yttrium oxide ($Y_2O_3$), aluminum nitride (AlN), alumina ($Al_2O_3$), and quartz ($SiO_2$). Antenna 109 serving as an upper electrode is disposed over dielectric member 108. Antenna 109 is electrically connected to first high-frequency power source 110A. Stage 111 is disposed on the bottom side in reaction chamber 103.

Gas introduction port 103a is connected to reaction chamber 103a. Process gas source 112 and ashing gas source 113 which are sources of supplying gas for generating plasma are respectively connected to gas introduction port 103a through a pipe. Further, exhaust port 103b is provided in reaction chamber 103, and pressure reducing mechanism 114 including a vacuum pump for reducing the pressure by exhausting the gas inside of reaction chamber 103 is connected to exhaust port 103b.

Stage 111 includes electrode layer 115, metal layer 116, base 117 supporting electrode layer 115 and metal layer 116, and outer peripheral portion 118 surrounding electrode layer 115, metal layer 116, and base 117, which are respectively in a substantially circular shape. Outer peripheral portion 118 is formed of a metal having conductivity and etching resistance and protects electrode layer 115, metal layer 116, and base 117 from plasma. Annular outer peripheral ring 129 is disposed on the upper surface of outer peripheral portion 118. Outer peripheral ring 129 has a role of protecting the upper surface of outer peripheral portion 118 from plasma. In a case where the outer diameter of outer peripheral ring 129 is larger than the outer diameter of outer peripheral portion 118, outer peripheral ring 129 controls the flow of various gases such that the gases supplied to the inside of reaction chamber 103 are unevenly distributed in the upper portion of stage 111.

Electrode layer 115 and outer peripheral ring 129 are formed of the above-described dielectric materials.

Electrode portion (hereinafter, referred to as an ESC electrode) 119 constituting the electrostatic adsorption mechanism and high-frequency electrode 120 electrically connected to second high-frequency power source 110B are disposed in the inside of electrode layer 115. DC power source 126 is electrically connected to ESC electrode 119. The electrostatic adsorption mechanism is configured of ESC electrode 119 and DC power source 126.

Metal layer 116 is formed of aluminum whose surface is coated with alumite. Refrigerant channel 127 serving as a cooling unit is formed in metal layer 116. Refrigerant channel 127 cools stage 111. When stage 111 is cooled, holding sheet 3 mounted on stage 111 is cooled and cover 124 having a portion in contact with stage 111 is also cooled. A refrigerant in refrigerant channel 127 is circulated by refrigerant circulating device 125.

A plurality of support portions 122 penetrating stage 111 are disposed in the vicinity of outer periphery of the stage 111. Support portions 122 are vertically driven by lifting mechanism 123A. When substrate carrier 10 is conveyed to the inside of reaction chamber 103, substrate carrier 10 is transferred to support portions 122 elevated to a predetermined position. Support portions 122 support frame 2 of substrate carrier 10. The upper end surfaces of support portions 122 are lowered to lower than or equal to the same level as stage 111, substrate carrier 10 is mounted on a predetermined position of stage 111.

A plurality of lifting rods 121 are connected to the end portion of cover 124 so that cover 124 can be lifted and lowered. Lifting rods 121 are vertically driven by lifting mechanism 123B. An operation of lifting and lowering cover 124, by lifting mechanism 123B, can be performed independently from lifting mechanism 123A.

Control device 128 controls operations of elements constituting plasma treatment unit 100 that includes first high-frequency power source 110A, second high-frequency power source 110B, process gas source 112, ashing gas source 113, pressure reducing mechanism 114, refrigerant circulating device 125, lifting mechanism 123A, lifting mechanism 123B, and the electrostatic adsorption mechanism.

Specific processes performed according to the plasma treatment method of the present embodiment will be described with reference to FIGS. 2A to 2G and 3A to 3F. In FIGS. 2A to 2G and 3A to 3F, as plasma treatment device 100A, a device that changes the distance between cover 124 and stage 111 by lifting and lowering cover 124 using lifting rods 121 is used, but the device is not limited thereto. FIGS. 2A to 2G are views schematically illustrating operations from the placing process to the plasma treatment process according to the plasma treatment method. FIGS. 3A to 3F are views schematically illustrating operations from the carrying-out process to the removal process according to the plasma treatment method.

Figure 2A:
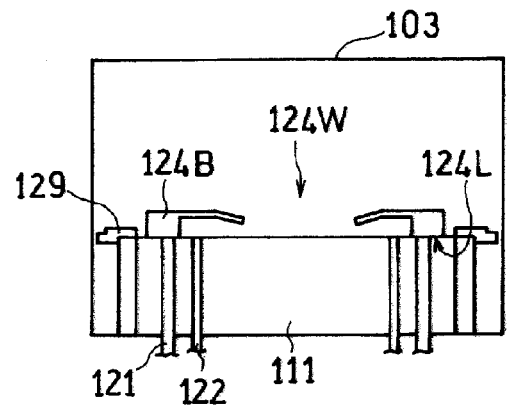
FIG. 2A is a view schematically illustrating a plasma treatment method according to an embodiment of the present disclosure.
Figure 2B:
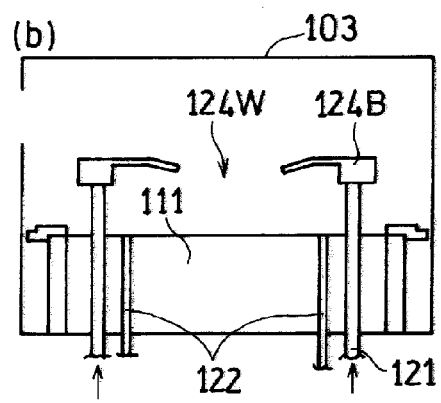
FIG. 2B is a view schematically illustrating the plasma treatment method according to the embodiment of the present disclosure.
Figure 2C:
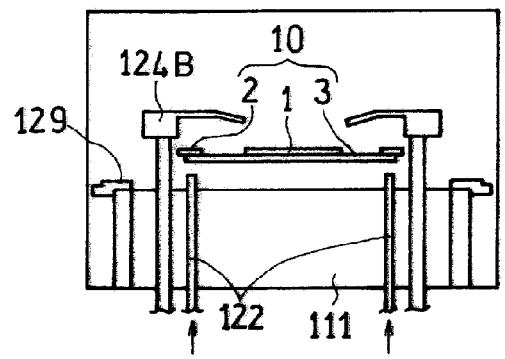
FIG. 2C is a view schematically illustrating the plasma treatment method according to the embodiment of the present disclosure.

From the placing process to the plasma treatment process illustrated in FIGS. 2A to 2G, stage 111 is cooled to, for example, approximately 15° C. using a constantly circulating refrigerant in refrigerant channel 127. Cover 124 is cooled by lower end 124L thereof being in contact with stage 111 until substrate carrier 10 is carried into reaction chamber 103 (FIG. 2A). Subsequently, lifting rods 121 are driven so that cover 124 is elevated to a predetermined position (FIG. 2B). Next, a gate valve (not illustrated) is open and substrate carrier 10 is carried thereinto. When substrate carrier 10 reaches a predetermined position in the upper portion of stage 111, a plurality of support portions 122 are elevated (FIG. 2C) and support substrate carrier 10. Substrate carrier 10 is placed on the upper end surface of support portions 122 such that the surfaces holding substrate 1 of holding sheet 3 face upward.

Figure 2D:
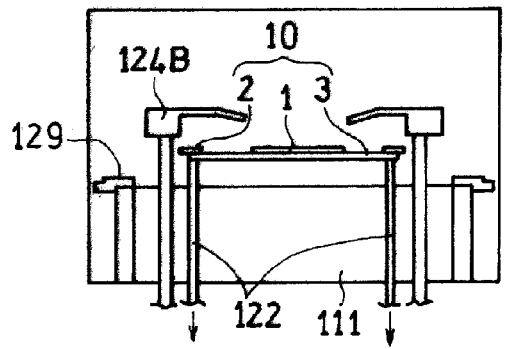
FIG. 2D is a view schematically illustrating the plasma treatment method according to the embodiment of the present disclosure.
Figure 2E:
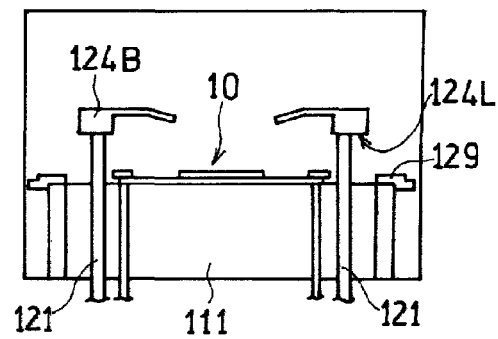
FIG. 2E is a view schematically illustrating the plasma treatment method according to the embodiment of the present disclosure.
Figure 2F:
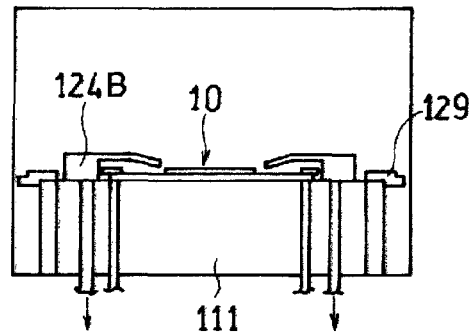
FIG. 2F is a view schematically illustrating the plasma treatment method according to the embodiment of the present disclosure.

When substrate carrier 10 is transferred to support portions 122, the gate valve is closed and reaction chamber 103 enters a sealed state. Next, support portions 122 start lowering (FIG. 2D). When the upper end surfaces of support portions 122 are lowered to lower than or equal to the same level as stage 111, substrate carrier 10 is mounted on stage 111 (FIG. 2E). Subsequently, lifting rods 121 are driven. Lifting rods 121 lower cover 124 to a predetermined position (FIG. 2F). At this time, the distance (first distance d1) between cover 124 and stage 111 is adjusted such that cover 124 covers frame 2 without coming into contact with substrate carrier 10 (distance adjustment process). Distance d1 is not particularly limited, but is, for example, approximately 0.5 mm to 1.5 mm. Distance d1 is the shortest distance between stage 111 and portion of main body portion 124B facing stage 111.

Next, the plasma treatment process is performed on substrate 1. At this time, a voltage is applied to an ESC type electrode. In this manner, substrate carrier 10 is electrostatically adsorbed by stage 111 and cooled. In the plasma treatment process, it is preferable that cover 124 is positioned where lower end 124L thereof is brought into contact with stage 111. When lower end 124L of the cover is cooled by being brought into contact with stage 111 during the plasma treatment process, thermal damage to substrate 1 and holding sheet 3 due to radiant heat of cover 124 can be suppressed. At this time, the temperature of holding sheet 3 is controlled to be in a range of 50° C. to 150° C. When cover 124 is cooled, a reaction product is easily adhered to the rear surface of main body portion 124B of the cover due to fluorocarbon gas used in a protective film deposition step described below. However, since the removal process is performed by separating cover 124 from stage 111 to have an appropriate distance therebetween after the plasma treatment process, the rear surface of main body portion 124B is sufficiently irradiated with plasma generated during the removal process. As a result, an adhesive matter on the rear surface of main body portion 124B is removed.

Main body portion 124B has a donut shape with an approximately circular outer contour and also has a constant width and a small thickness. The inner diameter of main body portion 124B (diameter of window portion 124W) is smaller than the inner diameter of frame 2 and the outer diameter of main body portion 124B is larger than the outer diameter of frame 2.

Therefore, when substrate carrier 10 is mounted on a predetermined position of the stage and lowers cover 124, main body portion 124B can cover at least a part of frame 2 and holding sheet 3. At least a part of substrate 1 is exposed from window portion 124W. Main body portion 124B is formed of a dielectric such as ceramics (for example, alumina or aluminum nitride) or quartz; or a metal such as aluminum or aluminum whose surface is alumite-treated.

When support portions 122 and cover 124 are disposed in a predetermined position, process gas is introduced to the inside of reaction chamber 103 by passing through gas introduction port 103a from process gas source 112. Pressure reducing mechanism 114 exhausts gas in the inside of reaction chamber 103 from exhaust port 103b so that a predetermined pressure is maintained in reaction chamber 103.

Figure 2G:
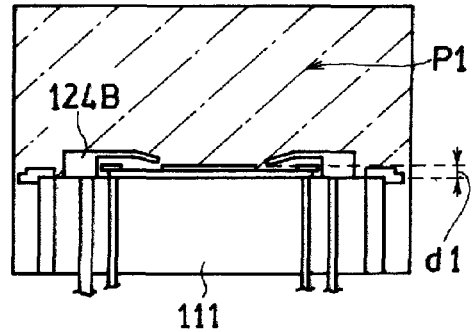
FIG. 2G is a view schematically illustrating the plasma treatment method according to the embodiment of the present disclosure.

Next, high-frequency voltage is supplied to antenna 109 from first high-frequency power source 110A to generate plasma P1 in the inside of reaction chamber 103 (FIG. 2G). Generated plasma P1 is formed of ions, electrons, and radicals. Subsequently, high-frequency voltage is supplied to high-frequency electrode 120 from second high-frequency power source 110B and the plasma treatment with respect to substrate 1 is started. The energy incident on substrate 1 of ions can be controlled using a bias voltage applied to high-frequency electrode 120 from second high-frequency power source 110B. From the surface to the rear surface of a portion exposed from a resist mask formed on substrate 1 is etched by a physicochemical reaction with generated plasma P1, and then substrate 1 is singulated.

The conditions of generating plasma are set according to the material or the like of substrate 1. For example, in a case where substrate 1 is made of Si, substrate 1 is etched by generating plasma P1 of fluorine-containing gas such as sulfur hexafluoride ($SF_6$) in reaction chamber 103. In this case, for example, the pressure of reaction chamber 103 is controlled to be in a range of 10 Pa to 50 Pa by pressure reducing mechanism 114 while supplying 100 sccm to 800 sccm of $SF_6$ gas from process gas source 112. 1000 W to 5000 W of high-frequency power at a frequency of 13.56 MHz is supplied to antenna 109 and 50 W to 1000 W of high-frequency power at a frequency of 13.56 MHz is supplied to high-frequency electrode 120. In addition, "sccm" indicates the unit of the flow rate. That is, 1 sccm means a flow rate of gas at 0° C. and 1 atm (standard state) flowing in an area of 1 $cm^3$ for 1 minute.

In order to perform vertical etching on the surface of substrate 1, an etching step using plasma, for example, fluorine-based gas such as $SF_6$ and a protective film deposition step using plasma fluorocarbon gas such as perfluorocyclobutane ($C_4F_8$) are alternately performed during the plasma treatment process. At this time, fluorocarbon gas used for the protective film deposition step enters the space between cover 124 and stage 111 and then a reaction product containing carbon is adhered to the rear surface of cover 124 in some cases (see FIG. 4A).

Substrate 1 is singulated by the above-described etching and electronic component 4 (chip) is obtained. Next, ashing is performed. Process gas for ashing (for example, oxygen gas or mixed gas of oxygen gas and gas containing fluorine) is introduced into reaction chamber 103 from ashing gas source 113. Pressure reducing mechanism 114 evacuates reaction chamber 103 so that the pressure therein is maintained to a predetermined pressure. Oxygen plasma is generated in reaction chamber 103 by supplying high-frequency voltage from first high-frequency power source 110A, and a resist mask on the surface of electronic component 4 exposed from window portion 124W of cover 124 is completely removed.

When the ashing is finished, the gas in reaction chamber 103 is discharged and the gate valve is open. Substrate carrier 10 holding electronic component 4 is carried out from reaction chamber 103 by conveyance mechanism that has entered from the gate valve (carrying-out process). When substrate carrier 10 is carried out, the gate valve is promptly closed.

Figure 3A:
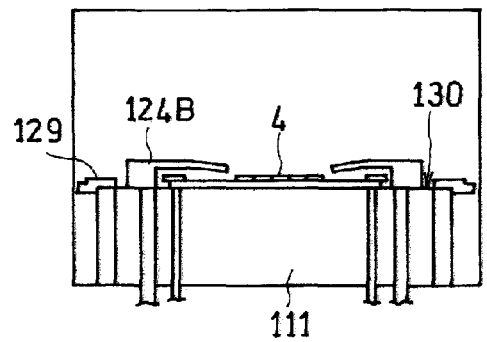
FIG. 3A is a view schematically illustrating the plasma treatment method according to the embodiment of the present disclosure.

Here, the carrying-out process of substrate carrier 10 may be performed in a reverse procedure to the procedure of mounting substrate carrier 10 on state 111 as described above. That is, as illustrated in FIGS. 3A to 3F, cover 124 is elevated to a predetermined position (FIG. 3B) after the plasma treatment process (FIG. 3A).

Figure 3B:
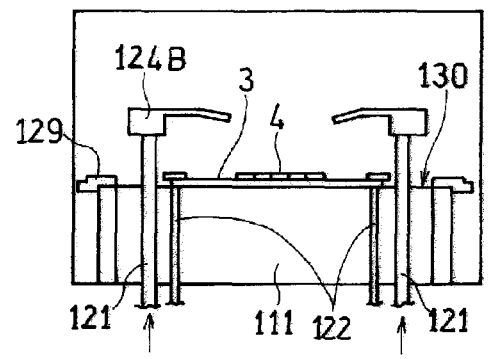
FIG. 3B is a view schematically illustrating the plasma treatment method according to the embodiment of the present disclosure.
Figure 3C:
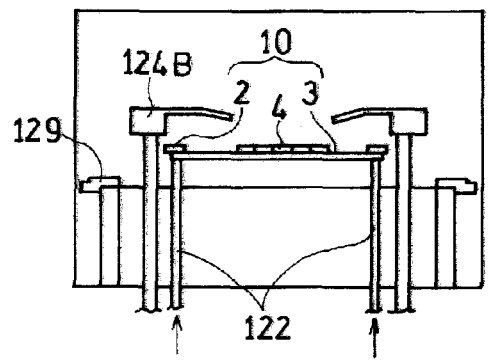
FIG. 3C is a view schematically illustrating the plasma treatment method according to the embodiment of the present disclosure.

Next, the voltage applied to the ESC type electrode (not illustrated) is set to zero, adsorption of substrate carrier 10 by stage 111 is released, and support portions 122 are elevated (FIG. 3C).

Figure 3D:
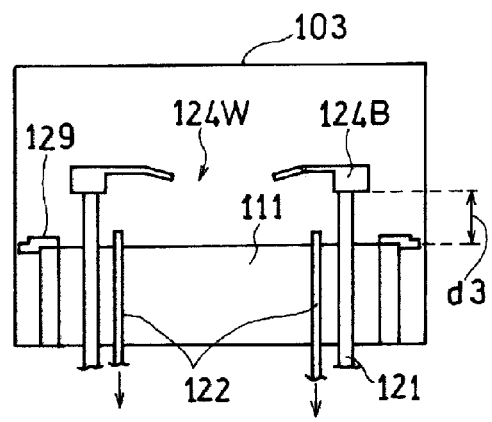
FIG. 3D is a view schematically illustrating the plasma treatment method according to the embodiment of the present disclosure.

When support portions 122 are elevated to a predetermined position and substrate carrier 10 is transferred to the conveyance mechanism, the end portions of support portions 122 are lowered to lower than or equal to the same level as stage 111, the gate valve is open, and substrate carrier 10 is carried out (FIG. 3D).

Figure 3E:
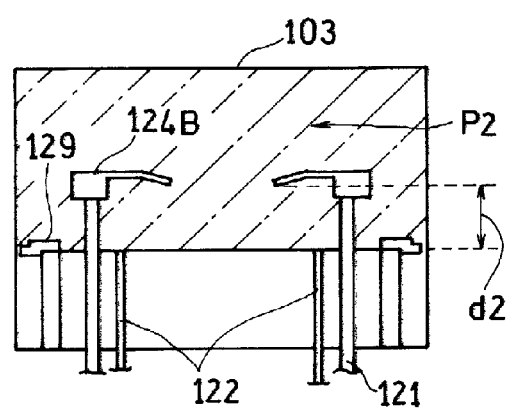
FIG. 3E is a view schematically illustrating the plasma treatment method according to the embodiment of the present disclosure.
Figure 3F:
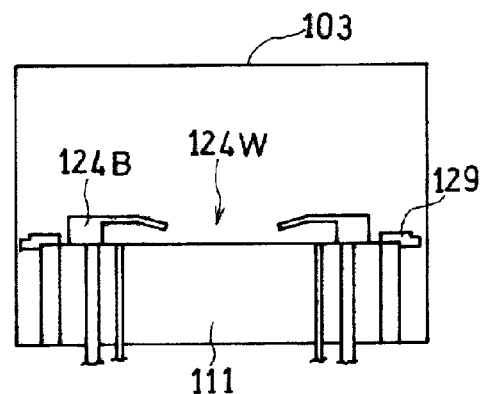
FIG. 3F is a view schematically illustrating the plasma treatment method according to the embodiment of the present disclosure.

After substrate carrier 10 is carried out and the gate valve is closed, the removal process is started. In other words, gas is supplied to the inside of reaction chamber 103 to generate plasma P2 (FIG. 3E). The distance (second distance d2) between cover 124 and stage 111 in the removal process is set to be greater than the distance (first distance d1) between cover 124 and stage 111 in the plasma treatment process. In this manner, plasma P2 easily enters the rear surface of main body portion 124B of cover, compared to the case of the plasma treatment process. Accordingly, an adhesive matter adhered to the rear surface of main body portion 124B of cover is etched by plasma P2 and removed.

Distance d2 between cover 124 and stage 111 in the removal process is not particularly limited as long as distance d2 is set to be greater than distance d1. When the distance between cover 124 and stage 111 at the time of cover 124 being positioned in a transfer position of substrate carrier 10 is set to third distance d3 (see FIG. 3D), distance d2 may be the same as distance d3 (d2=d3>d1), greater than distance d3 (d2>d3>d1), or smaller than distance d3 and greater than distance d1 (d3>d2>d1). It is preferable that distance d2 is greater than distance d3 from the viewpoint of increasing the effect for removing an adhesive matter, but it is preferable that distance d2 is less than or equal to distance d3 from the viewpoint of productivity.

After the carrying-out process, the removal process may be performed after cover 124 is lowered such that cover 124 is brought into contact with stage 111 and then cover 124 is cooled. At this time, the condition for generating plasma P2 is prepared, and then the removal process is started after cover 124 is elevated to distance d2 again or during the elevation. The removal process may be performed without cooling cover 124 (without lowering cover 124 such that cover 124 is brought into contact with stage 111) after the conveyance process. At this time, cover 124 may be slightly elevated (in a case of d2>d3) or lowered (in a case of d2<d3) such that the distance between cover 124 and stage 111 becomes distance d2, or may not be lifted or lowered (in a case of d2=d3). Although the above-described conditions are advantageous from the viewpoint of productivity, it is preferable that cover 124 is promptly lowered after the removal process is finished, lower end 124L is brought into contact with stage 111, and cover 124 is cooled.

Specifically, distance d2 is preferably greater than 1.5 mm and more preferably 2 mm or greater. When distance d2 is in this range, plasma P2 easily enters the rear surface of main body portion 124B of the cover and the effect for removing an adhesive matter is further increased. The upper limit of distance d2 is not particularly limited and may be suitably set in consideration of the productivity and the like.

During the removal process, it is preferable that distance d2 is changed in a state in which plasma P2 is generated. That is, it is preferable that cover 124 and/or stage 111 (in this case, cover 124) is lifted and lowered in a state in which plasma P2 is generated. When cover 124 and/or stage 111 is lifted and lowered, distribution of plasma P2 is changed and plasma P2 is easily and uniformly applied to the rear surface of main body portion 124B of the cover. Therefore, an adhesive matter is more easily removed.

From the viewpoint of increasing the effect for removing an adhesive matter, it is preferable that cover 124 is not cooled during the removal process. In the present embodiment, while lower end 124L of the cover is brought into contact with stage 111 and cover 124 is cooled during the plasma treatment process, cover 124 is disposed in a portion upper than that of the plasma treatment process so that cover 124 is not in contact with stage 111, and then cooling of cover 124 can be stopped. In other words, according to the present embodiment, the distance between cover 124 and stage 111 during the plasma treatment process and the removal process can be respectively and suitably set by changing the position of cover 124 with respect to stage 111, and a cooling state or a non-cooling state suitable for cover 124 according to each process can be prepared.

Figure 4A:
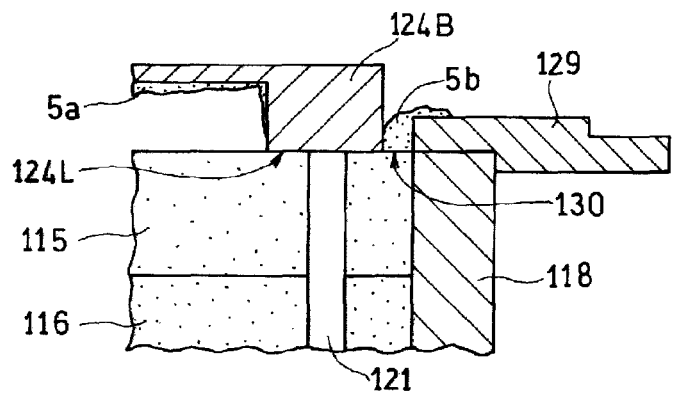
FIG. 4A is a sectional view schematically illustrating an operation of a part of the plasma treatment device of the present disclosure.

As described above, in a case where the plasma treatment device includes a mechanism of lifting and lowering cover 124 using lifting rods 121 disposed in the vicinity of the outer periphery of stage 111, lower end 124L of the cover is in contact to the upper surface of stage 111 (electrode layer 115) during the plasma treatment as illustrated in FIG. 4A. At this time, for example, when fluorocarbon gas used in the protective film deposition step is brought into contact with the upper surface of outer peripheral ring 129 and gap 130 between cover 124 and outer peripheral ring 129, adhesive matter 5b containing carbon is adhered to the upper surface of outer peripheral ring 129 and gap 130. The upper surface of outer peripheral ring 129 and gap 130 are unlikely to be exposed to plasma similar to the rear surface of main body portion 124B of the cover. Therefore, the plasma treatment process is occasionally finished in a state in which adhesive matter 5b is accumulated thereon.

Figure 4B:
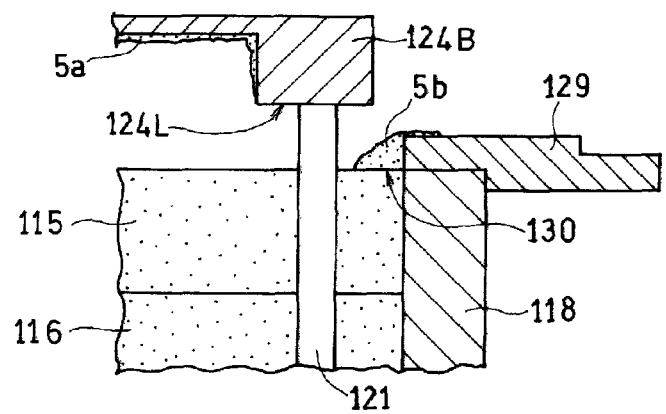
FIG. 4B is a sectional view schematically illustrating an operation of a part of the plasma treatment device of the present disclosure.
Figure 4C:
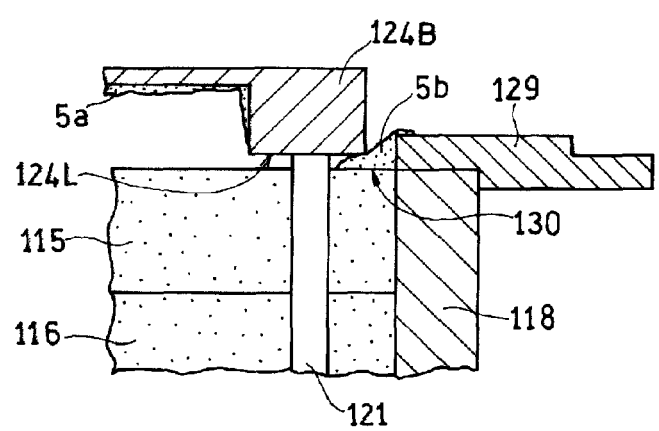
FIG. 4C is a sectional view schematically illustrating an operation of a part of the plasma treatment device of the present disclosure.

When the plasma treatment process is finished, lifting rods 121 are elevated in order to carry substrate carrier 10 out from the reaction chamber, adhesive matter 5b adhered to gap 130 is stimulated by the movement of cover 124 elevating together with lifting rod 121 and then enters immediately below lower end 124L of cover 124 (FIG. 4B). When the carrying out of the substrate carrier is finished, since cover 124 is cooled, lifting rods 121 are lowered to bring lower end 124L of cover 124 into contact with the upper surface of stage 111 again. At this time, since adhesive matter 5b enters immediately below lower end 124L, it is not possible to bring cover 124 into contact with stage 111 (FIG. 4C). Accordingly, cover 124 is not sufficiently cooled.

During the plasma treatment, the upper surface (surface on the opposite side of the rear surface) of cover 124 is exposed to plasma. Therefore, the temperature of entire cover 124 is high (for example, 250° C. or higher). After the plasma treatment is finished, cover 124 is not immediately cooled and continuously radiates heat to the surroundings. When next substrate 1 is placed on stage 111 in this state, holding sheet 3 holding substrate 1 is thermally damaged in some cases. Therefore, it is desired that cover 124 is cooled by being brought into contact with stage 111 even after the plasma treatment process is finished, if possible.

The phenomenon illustrated in FIGS. 4B and 4C may occur from when cover 124 is elevated to a predetermined position (FIG. 3B) to when cover 124 is lowered (FIG. 3F) after the plasma treatment process. However, this cooling failure can be solved by suitably setting the distance (second distance d2) between the cover 124 and the stage 111 in the removal process performed between the process of FIG. 3B and the process of FIG. 3F.

In other words, when distance d2 between cover 124 and stage 111 in the removal process is set to be greater than distance d1 between cover 124 and stage 111 in the plasma treatment process, plasma P2 also easily enters immediately below lower end 124L of cover 124 to which adhesive matter 5b is adhered. Therefore, adhesive matter 5a adhered to the rear surface of cover 124 and adhesive matter 5b having entered immediately below lower end 124L of cover 124 can be removed.

From the viewpoint of increasing the effect for removing an adhesive matter, it is preferable that the removal process is performed in an oxygen atmosphere. The oxygen atmosphere indicates an atmosphere in which the content of oxygen with respect to the entire gas included in the reaction chamber is in a range of 50% by volume to 100% by volume (the same applies to hereinafter). From the viewpoint of the removal efficiency, the content of oxygen is preferably in a range of 80% by volume to 100% by volume and more preferably in a range of 95% by volume to 100% by volume.

In the removal process, the pressure of reaction chamber 103 is controlled to be in a range of 5 Pa to 10 Pa using pressure reducing mechanism 114 while supplying 150 sccm to 200 sccm of $O_2$ gas and 0 sccm to 50 sccm of $CF_4$ from ashing gas source 113. Approximately 1 kW to 5 kW of high-frequency power at a frequency of 13.56 MHz is supplied to antenna 109 and 0 W to 30 W of high-frequency power at a frequency of 13.56 MHz is supplied to high-frequency electrode 120. The removal process is performed under these conditions for 1 minute to 2 minutes.

After the removal process, cover 124 is lowered to a position in which a part of cover 124 is brought into contact with stage 111 (FIG. 3F) and then cover 124 is cooled. In this manner, a series of processes are finished. Cover 124 stands by until next substrate 1 is conveyed in this state (FIG. 2A) and processes illustrated in the figures subsequent to FIG. 5B is performed again.

Moreover, a destaticizing process of destaticizing holding sheet 3 may be provided before support portions 122 in the carrying process is elevated (for example, during or after elevation of cover 124 in FIG. 3B) because it is difficult to smoothly peel holding sheet 3 off from stage 111 in a case where a charge at the time of the plasma treatment remains in holding sheet 3 and the remaining charge of holding sheet 3 is adsorbed by stage 111. The destaticization may be performed by, for example, supplying a weak high-frequency power of approximately 200 W from first high-frequency power source 110A and generating weak plasma. At this time, a small space may be formed between at least a part of holding sheet 3 and stage 111 by elevating supporting portions 122 only by a small distance. In this manner, since weak plasma can go around the space between holding sheet 3 and stage 111, the destaticizing effect is further increased. Holding sheet 3 is smoothly peeled off from stage 111 due to the destaticization and thus problems such as damage to holding sheet 3 at the time of carrying holding sheet 3 out are suppressed and the yield of an electronic component is further improved.

A cooling process of cooling cover 124 by introducing gas for cooling into reaction chamber 103 may be provided during a time period from when the ashing is finished to when support portions 122 are elevated (FIGS. 3A to 3C). In this manner, thermal damage to holding sheets 3 due to radiant heat from cover 124 can be more easily suppressed. From the viewpoint of suppressing thermal damage to holding sheets 3, it is preferable that the above-described cooling process is performed after cover 124 is elevated to a predetermined position and cover 124 is moved away from holding sheets 3 (FIG. 3B).

Figure 5A:
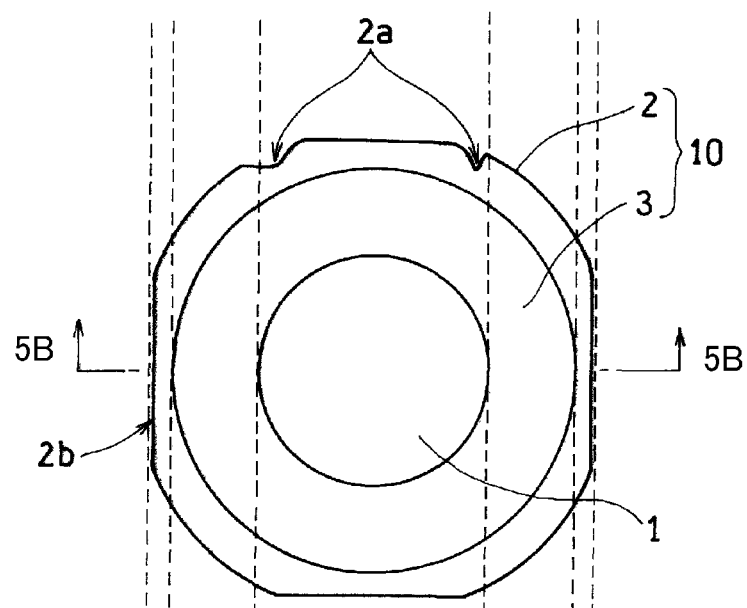
FIG. 5A is a top view schematically illustrating an example of a substrate carrier according to the present disclosure.
Figure 5B:
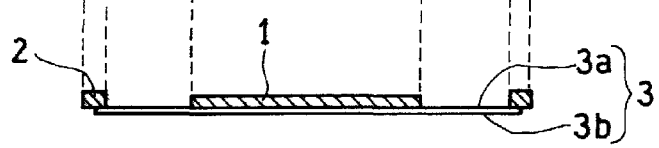
FIG. 5B is a sectional view taken along line 5B-5B of the substrate carrier in FIG. 5A.

Next, an embodiment of substrate 1 and substrate carrier 10 will be described with reference to FIGS. 5A and 5B. FIG. 5A is a top view schematically illustrating substrate carrier 10 and substrate 1 held by substrate carrier 10 and FIG. 5B is a sectional view taken along line 5B-5B of FIG. 5A illustrating substrate 1 and substrate carrier 10. Further, in FIGS. 5A and 5B, a case where the shapes of frame 2 and substrate 1 are both substantially circular is illustrated, but the shapes thereof are not limited thereto.

As illustrated in FIG. 5A, substrate carrier 10 includes frame 2 and holding sheet 3. The outer peripheral portion of holding sheet 3 is fixed to frame 2. Substrate 1 is bonded to holding sheet 3 and held by the substrate carrier.

(Frame)

Frame 2 has an opening having an area greater than or equal to the entire area of substrate 1 and has a predetermined width and a substantially constant small thickness. Frame 2 has rigidity to the extent that frame 2 is capable of conveying holding sheet 3 and substrate 1 in a state of holding them.

The shape of the opening of frame 2 is not particularly limited, and examples thereof include polygons such as a circle, a square, and a hexagon. Frame 2 may be provided with notch 2a or corner cut 2b for positioning. Examples of the material of frame 2 include metals such as aluminum and stainless steel and resins. The vicinity of the outer peripheral edge of one surface of holding sheet 3 is bonded to one surface of frame 2.

(Holding Sheet)

Holding sheet 3 includes a surface (adhesive surface 3a) having an adhesive and a surface (non-adhesive surface 3b) which does not have an adhesive. The outer peripheral edge of adhesive surface 3a is bonded to one surface of frame 2 and covers an opening of frame 2. Further, substrate 1 is bonded to a portion exposed from the opening of frame 2 of adhesive surface 3a.

It is preferable that adhesive surface 3a is formed of an adhesive component having adhesive force which is decreased when irradiated with ultraviolet rays. Since an singulated substrate (electronic component) is easily peeled off from adhesive surface 3a when irradiated with ultraviolet rays after dicing, the substrate can be easily picked up. For example, holding sheet 3 can be obtained by coating one surface of a film-like base material with a UV-curable acrylic adhesive at a thickness of 5 μm to 20 μm.

The material of the film-like base material is not particularly limited, and examples thereof include polyolefin such as polyethylene or polypropylene and polyester such as polyethylene terephthalate.

Various additives such as a rubber component, a plasticizer, a softener, an antioxidant, and a conductive material may be blended in the base material. For example, the thickness of the base material is in a range of 50 μm to 150 μm.

(Substrate)

Substrate 1 is an object for the plasma treatment. Substrate 1 is prepared by forming a circuit layer such as a semiconductor circuit, an electronic component element, or an MEMS on one surface of the main body portion and grinding the surface on the opposite side of the circuit layer of the main body portion, and reducing the thickness. When substrate 1 is singulated, an electronic component (not illustrated) having the above-described circuit layer is obtained.

The size of substrate 1 is not particularly limited. For example, the maximum diameter thereof is approximately in a range of 50 mm to 300 mm and the thickness thereof is approximately in a range of 25 μm to 150 μm. The shape thereof is not particularly limited, and examples thereof include a circle and a square. Further, substrate 1 may be provided with an orientation flat or a notch (both not illustrated).

The material of the main body portion of substrate 1 is not also particularly limited, and examples thereof include a semiconductor, a dielectric, a metal, and a laminate of these. Examples of the semiconductor include silicon (Si), gallium arsenide (GaAs), gallium nitride (GaN), and silicon carbide (SiC). Examples of the dielectric include silicon dioxide ($SiO_2$), silicon nitride ($Si_3N_4$), polyimide, lithium tantalate ($LiTaO_3$), and lithium niobate ($LiNbO_3$).

A resist mask (not illustrated) is formed, in a desired shape, on a surface of substrate 1 which is not bonded to holding sheet 3. A portion on which a resist mask is formed is protected from being etched due to plasma. A portion on which a resist mask is not formed may be etched from the surface to the rear surface thereof due to plasma.

Second Embodiment

Figure 6:
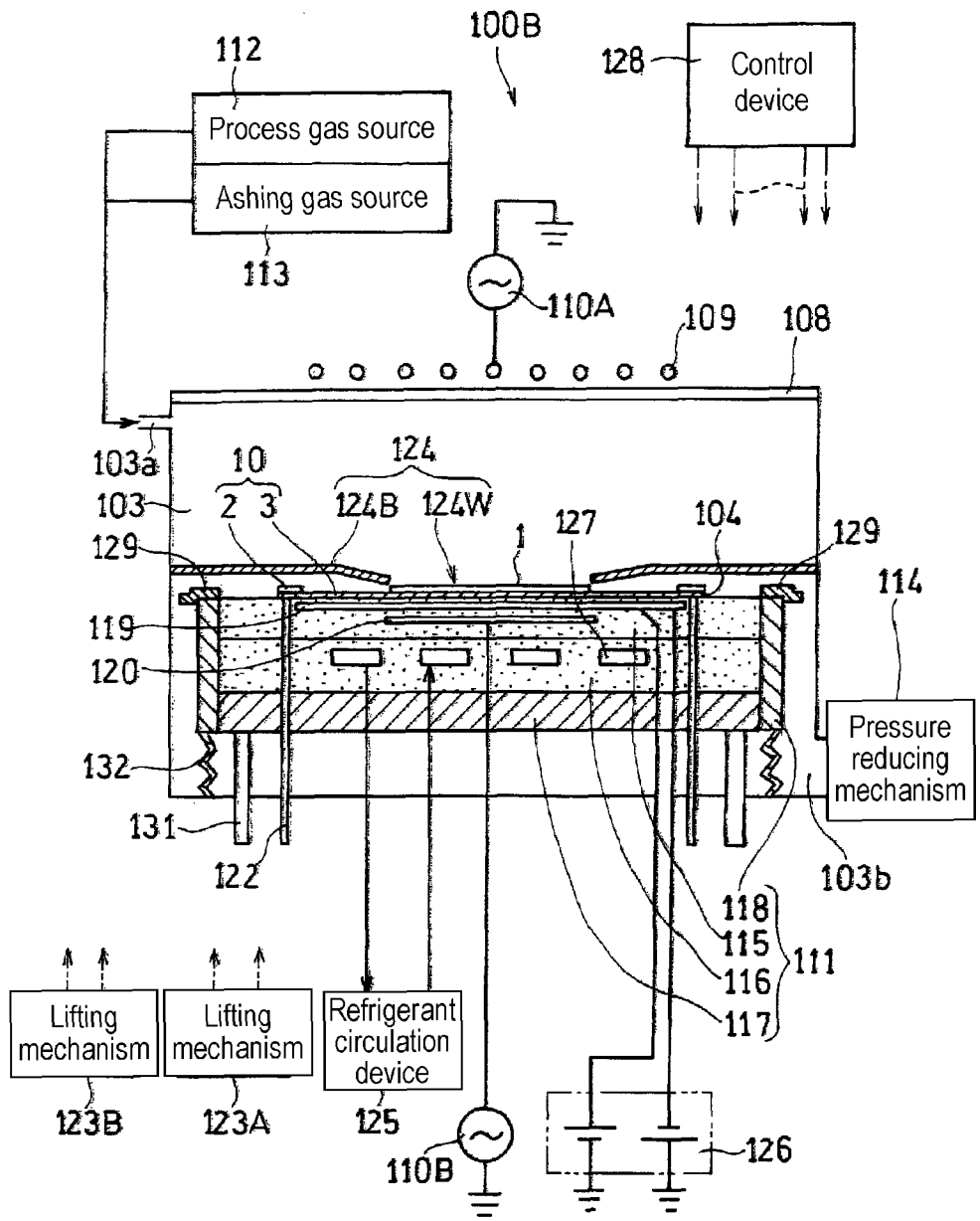
FIG. 6 is a sectional view schematically illustrating another example of the plasma treatment device according to the present disclosure.

A second embodiment relates to the first plasma treatment method and the first method of manufacturing an electronic component. In the present embodiment, plasma treatment device 100B illustrated in FIG. 6 is used in place of plasma treatment device 100A. Plasma treatment device 100B has the same configurations as those of plasma treatment device 100A except that cover 124 is connected to reaction chamber 103, the end portion of lifting rod 131 is connected to stage 111, and bellows (expansion pipe) 132 is disposed between the lower surface of stage 111 and the bottom of reaction chamber 103. Moreover, FIG. 6 is a view illustrating a section of plasma treatment device 100B.

Figure 7A:
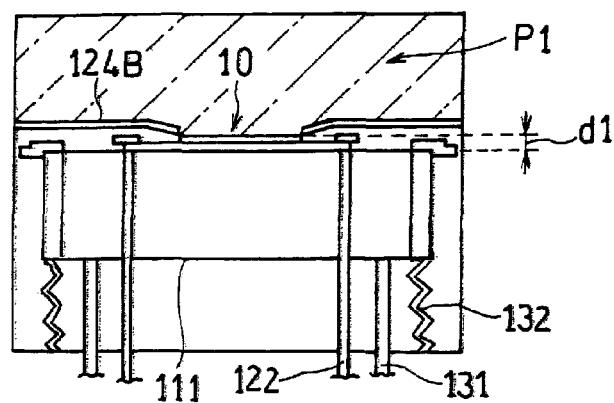
FIG. 7A is a view schematically illustrating a positional relationship between a cover and a stage in a plasma treatment process and a removal process using the plasma treatment device illustrated in FIG. 6.
Figure 7B:
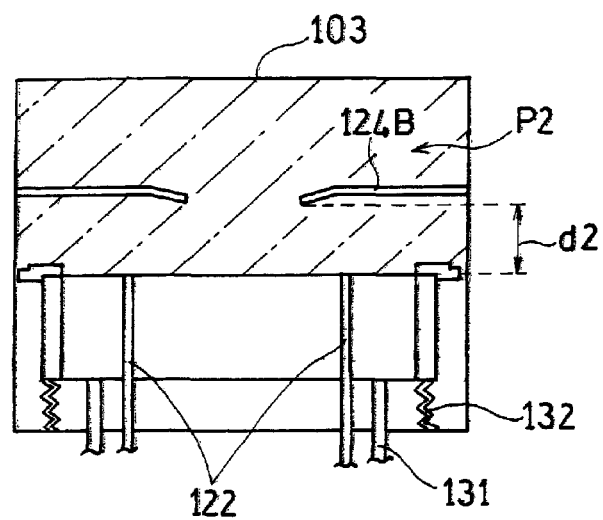
FIG. 7B is a view schematically illustrating the positional relationship between the cover and the stage in the plasma treatment process and the removal process using the plasma treatment device illustrated in FIG. 6.

Plasma treatment device 100B changes the distance between cover 124 and stage 111 by lifting and lowering stage 111. Stage 111 is lifted, lowered, and supported by lifting rod 131. Bellows 132 is a bellows-like pipe having a diameter which is substantially the same as the diameter of stage 111, and a part of lifting rod 131 or support portions 122 is disposed in the inside of bellows 132. Various wirings (not illustrated) (such as a wiring connecting second high-frequency power source 110B with high-frequency electrode 120 and a wiring connecting DC power source 126 with ESC electrode 119) and a pipe connecting refrigerant circulating device 125 with refrigerant channel 127 are disposed in the inside of bellows 132. The internal space of bellows 132 is separated from the space of reaction chamber 103 into which process gas is introduced. FIGS. 7A and 7B illustrate a positional relationship between cover 124 and stage 111 in the plasma treatment process and the removal process using plasma treatment device 100B. As illustrated in FIG. 7A, distance d1 is maintained between the cover and the stage during the plasma treatment process. In the removal process, stage 111 is lowered to a level lower than that of the plasma treatment process and distance d2 between cover 124 and stage 111 is set to be greater than distance d1 as illustrated in FIG. 7B.

In the present embodiment, a cooling unit (refrigerant channel 127) disposed in the inside of stage 111 mainly contributes to cooling of substrate carrier 10. Cover 124 may be cooled by being brought into contact with a side wall of reaction chamber 103 that is cooled by a cooling device (not illustrated). Alternatively, cover 124 may be cooled by providing a refrigerant channel (not illustrated) in the inside of cover 124 and circulating the refrigerant using a refrigerant circulating device (not illustrated). At this time, the side wall of reaction chamber 103 may be provided with a through hole connecting the channel in the inside of the cover with the refrigerant circulating device disposed outside of reaction chamber 103. From the viewpoint of suppressing a decrease in removal effect, it is preferable that a cooling mechanism with respect to the cover and the stage is stopped such that cover 124 is not cooled during the removal process.

Third Embodiment

A third embodiment relates to the second plasma treatment method and the second method of manufacturing an electronic component.

Substrate carrier 10 illustrated in FIGS. 5A and 5B described above is also used in the third embodiment.

As illustrated in FIG. 5A, substrate carrier 10 includes holding sheet 3 formed of substrate 1, frame 2, and a resin. The outer peripheral portion of holding sheet 3 is fixed to frame 2. Substrate 1 is bonded to holding sheet 3 and held by the substrate carrier. Substrate 1 and frame 2 which are the same as those in the first embodiment can be used here.

(Resin Sheet)

Holding sheet 3 includes a surface (adhesive surface 3a) having an adhesive and a surface (non-adhesive surface 3b) which does not have an adhesive. The outer peripheral edge of adhesive surface 3a is bonded to one surface of frame 2 and covers an opening of frame 2. Further, substrate 1 is bonded to a portion exposed from the opening of frame 2 of adhesive surface 3a.

It is preferable that adhesive surface 3a is formed of an adhesive component having adhesive force which is decreased when irradiated with ultraviolet rays. Since an singulated substrate (electronic component) is easily peeled off from adhesive surface 3a when irradiated with ultraviolet rays after dicing, the substrate can be easily picked up. For example, holding sheet 3 can be obtained by coating one surface of a film-like base material with a UV-curable acrylic adhesive at a thickness of 5 µm to 20 µm.

The material of the film-like base material is not particularly limited, and examples thereof include polyolefin such as polyethylene or polypropylene and polyester such as polyethylene terephthalate. Various additives such as a rubber component (such as ethylene-propylene rubber (EPM) or ethylene-propylene-diene rubber (EPDM)) for providing elasticity, a plasticizer, a softener, an antioxidant, and a conductive material may be blended in the base material. For example, the thickness of the base material is in a range of 50 µm to 150 µm. During the plasma treatment, substrate carrier 10 is placed on the stage such that the stage does not come into contact with non-adhesive surface 3b. During the plasma treatment, at least some (particularly, an organic matter) of the above-described various additives are bled out from the based material and adhered to the surface of the stage.

Figure 8:
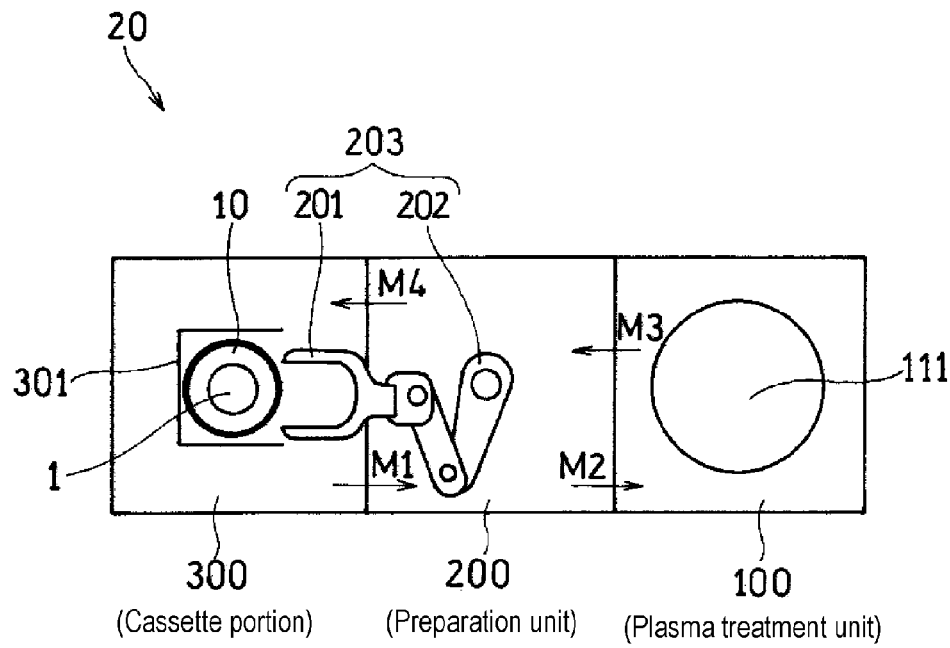
FIG. 8 is a view schematically illustrating the plasma treatment device according to the embodiment of the present disclosure.

Next, the outline of a plasma treatment method according to an embodiment will be described with reference to FIG. 8. FIG. 8 is a view schematically illustrating plasma treatment device 20 used for a plasma treatment method according to an embodiment. In FIG. 8, M1 to M4 show operations of conveyance mechanism 203 (entering and leaving each unit).

Plasma treatment device 20 includes cassette portion 300 that stores substrate carrier 10 held by the substrate 1, a preparation unit 200 that includes conveyance mechanism 203 for conveying substrate carrier 10, and plasma treatment unit 100. Preparation unit 200 is interposed between cassette portion 300 and plasma treatment unit 100, and substrate carrier 10 carried out from cassette portion 300 is carried into plasma treatment unit 100 through preparation unit 200. Cassette portion 300 includes cassette 301 for storing a plurality of substrate carriers 10. Conveyance mechanism 203 includes conveyance fork 201 and conveyance arm 202 that supports conveyance fork 201. Plasma treatment unit 100 includes stage 111 that places substrate carrier 10. Plasma treatment unit 100 individuates substrate 1 by performing the plasma treatment on substrate 1 placed on stage 111. The configurations other than stage 111 of plasma treatment unit 100 will be described later.

Processes from the start to end for a lot in a case of using plasma treatment device 20 are as follows.

First, substrate carrier 10 provided for the plasma treatment is selected from a plurality of substrate carriers. Selected substrate carrier 10 is carried out from cassette portion 300 by conveyance mechanism 203 (M1). Position adjustment or inspection of presence or absence of substrate 1 is performed on carried-out substrate carrier 10 in preparation unit 200 as needed. Subsequently, substrate carrier 10 is carried into plasma treatment unit 100 (M2).

Here, from the viewpoint of improving efficiency of the plasma treatment, it is preferable that plasma treatment unit 100 is maintained in a vacuum state during carrying in and out from substrate carrier 10. Therefore, in a case where cassette portion 300 is under the atmospheric pressure, preparation unit 200 is sealed and decompressed by a vacuum pump (not illustrate) after substrate carrier 10 is carried thereinto. After preparation unit 200 is decompressed, a gate valve (not illustrated) of plasma treatment unit 100 is open, and substrate carrier 10 is carried into plasma treatment unit 100 and placed on stage 111. At this time, conveyance fork 201 holds the substrate carrier on a surface side of holding sheet 3 which does not hold substrate 1. Substrate carrier 10 is placed on stage 111 such that holding sheet 3 comes into contact with the stage of plasma treatment unit 100. After substrate carrier 10 is placed, conveyance mechanism 203 is left from plasma treatment unit 100 and the gate valve is closed again.

In plasma treatment unit 100, the plasma treatment (etching and ashing) is performed on the substrate placed on stage 111. When the plasma treatment is finished, the gate valve of plasma treatment unit 100 is open again and substrate carrier 10 is carried out from plasma treatment unit 100 by conveyance mechanism 203 (M3). When the carrying-out of the substrate carrier is finished, the gate valve is closed. Carried-out substrate carrier 10 is stored in cassette 301 of cassette portion 300 after preparation unit 200 is inspected as needed (M4).

In plasma treatment unit 100 in which substrate carrier 10 is carried out and the gate valve is closed, process gas is supplied thereto and the plasma treatment is started. This plasma treatment is performed for the purpose of removing an adhesive matter which is adhered to stage 111 and derived from a resin sheet. When an adhesive matter adhered to stage 111 is removed, gas inside of plasma treatment unit 100 is discharged and plasma treatment unit 100 enters a vacuum state again. After plasma treatment unit 100 enters a vacuum state, substrate carrier 10 holding another substrate 1 is carried into plasma treatment unit 100 by conveyance mechanism 203 and the above-described plasma treatment is repeated.

In a case where a sequence of the placing process, the plasma treatment process, and the carrying-out process is continuously performed on a plurality of substrate carriers, the removal process of removing an adhesive matter may be performed at any timing if substrate carrier 10 is not present in plasma treatment unit 100. It is preferable that the removal process is performed using a time period from when a plasma-treated substrate carrier is carried out in the N-th sequence to when a substrate carrier which is a target for the plasma treatment is placed in the (N+1)-th sequence. Since the removal process is performed using the time (for example, the time for conveying substrate carrier 10) constantly required during a series of treatments performed on one substrate carrier 10, an increase in required time can be suppressed even when the removal process is added. In other words, the productivity is not damaged. On the contrary, since the etching rate is high and stabilized by removing an adhesive matter even when treatments are continuously performed on a plurality of substrates, the efficiency of the plasma treatment is improved and the productivity is increased.

For example, the removal process may be started promptly after the plasma treatment is finished, plasma-treated substrate carrier 10 is carried out from plasma treatment unit 100, and the gate valve is closed. In this case, since plasma-treated substrate carrier 10 is moving toward cassette portion 300, the removal process is started at the timing immediately before treated substrate carrier 10, which is the latest one, is completely stored in cassette portion 300.

Further, the removal process may be started after plasma-treated substrate carrier 10 is stored in cassette 301 and before the conveyance process of substrate carrier 10, which is a target for the next plasma treatment, is started. Specifically, it is preferable to perform the removal process during the selection of substrate carrier 10 or during the movement of substrate carrier 10 from preparation unit 200 to plasma treatment unit 100. In this case, the removal process is started at the timing immediately after the start of the selection of or the conveying process of substrate carrier 10 which is a target for the next plasma treatment.

Moreover, the removal process may be performed at each time when the plasma treatment applied to one substrate carrier is finished or started or may be performed for each treatment applied to a plurality of substrate carriers.

Figure 9:
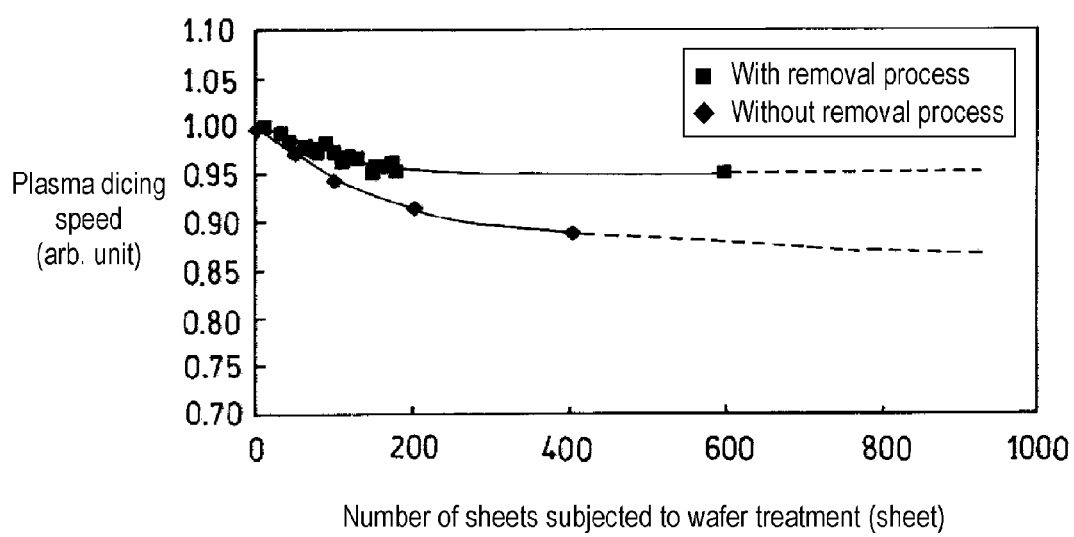
FIG. 9 is a graph showing a change in plasma dicing speed according to the embodiment of the present disclosure.

FIG. 9 shows a change in plasma dicing speed (depth of etching per unit time) in a case where a plurality of substrates held by resin sheets (made of polyolefin resin) are placed on the stage and are continuously subjected to plasma dicing. The used substrates are Si substrates having a thickness of 100 μm and mask patterns are formed on each surface of the substrates. In the figure, the unit (arb. unit) of plasma dicing speed indicates an arbitrary unit. In a case where the removal process is not performed, there is a tendency that the plasma dicing speed is decreased when the number of treated substrates is increased. Meanwhile, in a case where the removal process is performed, the plasma dicing speed is slightly decreased immediately after the removal process is started, but it is understood that the plasma dicing speed tends to show constantly high values and is stabilized after the decrease. Moreover, in a case where a Si substrate which is not held by a resin sheet is placed directly on the stage and continuously subjected to plasma dicing, the extent of a decrease in plasma dicing speed is smaller than the case where the removal process is not performed and the same as the case where the removal process is performed. In other words, an adhesive matter derived from a resin sheet greatly influences on the plasma dicing speed, but the impact thereof becomes extremely small due to the removal process.

The reason for a decrease in plasma dicing speed when the number of treated substrates is increased in the case where the removal process is not performed is assumed as follows.

Individuation of a Si substrate resulting from plasma dicing is performed by vertically etching (deep etching) an opening portion of a mask of the Si substrate in the depth direction. At this time, a so-called Bosch process is typically used. In the Bosch process, an etching step using plasma for etching and a protective film deposition step using plasma for depositing a protective film are alternately repeated. In the etching step, the Si substrate exposed to the opening portion of the mask is etched in the depth direction so that a groove is formed. In the protective film deposition step, the surface of the inner wall of the groove formed during the etching step is covered by a protective film. In the etching step to be performed next, the protective film that covers the bottom of the groove is removed and the Si substrate exposed to the bottom is etched in the depth direction. At this time, since the side wall of the groove is still covered by the protective film, the side wall thereof is unlikely to be etched by the etching step. When such an etching step and a protective film deposition step are alternately repeated, the substrate can be deeply vertically etched in the depth direction in the opening portion of the mask.

In the case where the removal process is not performed, an adhesive matter derived from a resin sheet is adhered to the surface of the stage, and an effect for cooling the substrate is reduced. Therefore, the temperature of the substrate during the plasma treatment is increased. The increase in temperature of the substrate causes two contradictory effects on the etching rate in the etching step.

The first effect is an increase in etching rate in the etching step. The etching rate is increased because the reactivity between plasma and a Si substrate is increased when the temperature of a substrate becomes high.

The second effect is a decrease in etching rate in the etching step.

An increase in temperature of a substrate inhibits deposition of a protective film in the protective film deposition step because an elimination reaction of deposits in the substrate is promoted when the temperature of the substrate becomes high. Therefore, a protective film is unlikely to be formed on the side surface of the groove. When the temperature of the substrate is further increased, a portion, on the side surface of the groove, on which a protective film is not formed, that is, an exposed portion of the Si substrate is generated. In other words, when the temperature of the Si substrate is increased, the area of the Si substrate exposed to a portion other than the bottom of the groove is increased. When the area of the Si substrate exposed to the portion other than the bottom of the groove is increased, components (ions or radicals) in plasma contributing to etching of the Si substrate in the etching step are consumed by reacting with the Si substrate exposed to the portion other than the bottom of the groove (that is, the side surface of the groove) and, therefore, are not sufficiently supplied to the bottom of the groove. As a result, the etching rate with respect to the bottom of the groove is decreased (loading effect).

In other words, an increase in temperature of the substrate acts to increase the etching rate in the etching step, but also act to decrease the etching rate at the same time. In the case where the removal process is not performed, it is considered that a decrease in etching rate with respect to the bottom of the groove resulting from the loading effect exceeds an increase in etching rate resulting from the increase in temperature when the number of treated substrates is increased. Therefore, the plasma dicing rate is decreased. When the plasma dicing rate is decreased, the productivity is degraded. Further, when the etching rate with respect to the side surface is relatively increased, vertical deep etching becomes difficult and thus individuation in a desired shape becomes difficult.

In the third embodiment, the plasma treatment unit 100 illustrated in FIG. 1 which is the same as that of the first embodiment can be used.

Figure 10:
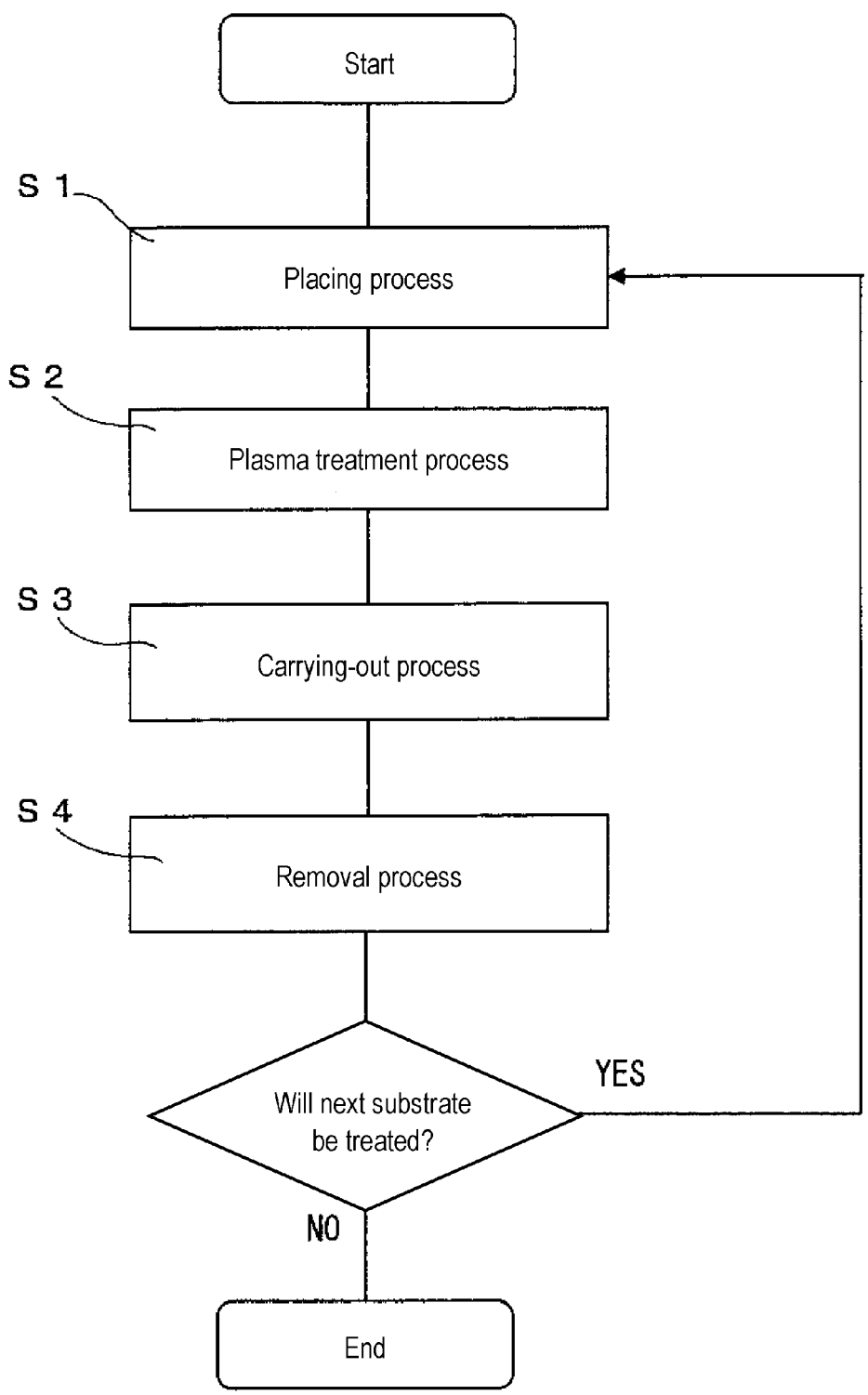
FIG. 10 is a flowchart showing the plasma treatment method according to the embodiment.

Specific processes performed according to the plasma treatment method of the present embodiment will be described with reference to FIGS. 10 and 11A to 11E. FIG. 10 is a flowchart showing the plasma treatment method and FIGS. 11A to 11E are views schematically illustrating a part of the operations of the plasma treatment unit.

Prior to the placing process (S1), a plurality of substrate carriers 10 are stored in cassette 301 included in cassette portion 300. Conveyance mechanism 203 is operated so that conveyance fork 201 enters cassette portion 300 and holds one of a plurality of substrate carriers 10. Next, conveyance fork 201 exits from cassette portion 300 in a state of holding substrate carrier 10. Preparation unit 200 into which substrate carrier 10 is carried is sealed and enters a vacuum state due to a vacuum pump. When it is confirmed that preparation unit 200 is in a vacuum state, the gate valve of plasma treatment unit 100 is open and the placing process (S1) is started.

Figure 11A:
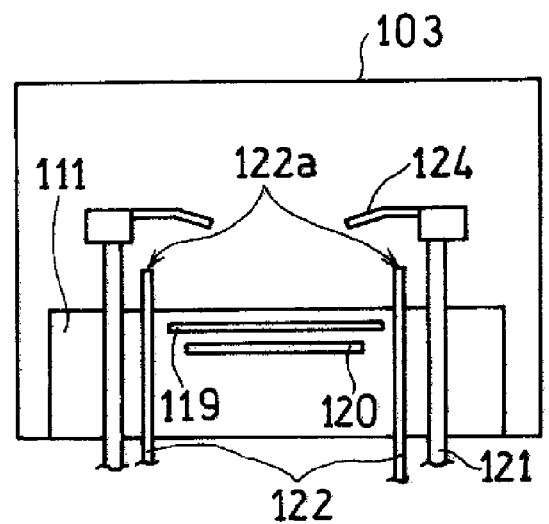
FIG. 11A is view schematically illustrating a part of an operation of a plasma treatment unit according to the embodiment of the present disclosure.
Figure 11B:
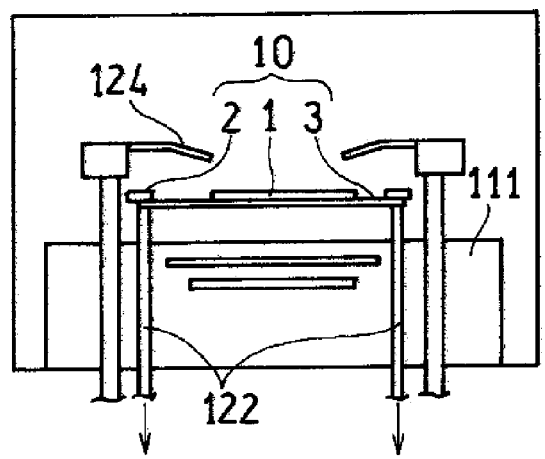
FIG. 11B is view schematically illustrating a part of the operation of the plasma treatment unit according to the embodiment of the present disclosure.

In the placing process (S1), conveyance mechanism 203 conveys substrate carrier 10 into plasma treatment unit 100 and places substrate carrier 10 on stage 111. At this time, a plurality of support portions 122 stand by in a state of being elevated in reaction chamber 103 in order to support substrate carrier 10. Cover 124 also stands by in a position being elevated (FIG. 11A). Substrate carrier 10 is conveyed into reaction chamber 103 by a conveyance mechanism (not illustrated) and transferred to the plurality of support portions 122 (FIG. 11B). Substrate carrier 10 is placed on upper end surfaces 122a of support portions 122 such that the surface (adhesive surface 3a) holding substrate 1 of holding sheet 3 is directed upward.

Conveyance fork 201 exits when substrate carrier 10 is placed on upper end surfaces 122a of support portions 122. When it is confirmed that conveyance fork 201 exits, the gate valve (not illustrated) that separates plasma treatment unit 100 from preparation unit 200 is closed so that plasma treatment unit 100 enters a sealed state. Next, the plasma treatment is performed on substrate 1 (plasma treatment process: S2).

Figure 11C:
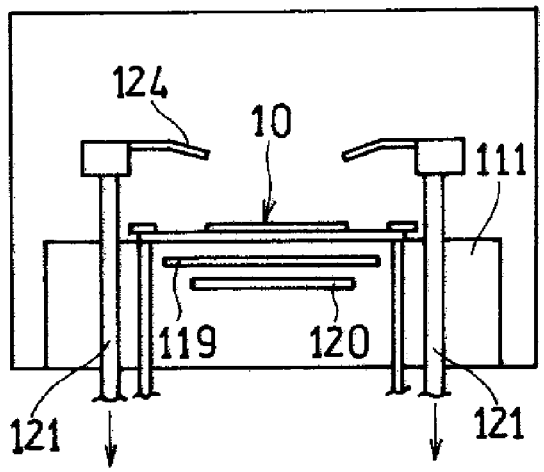
FIG. 11C is view schematically illustrating a part of the operation of the plasma treatment unit according to the embodiment of the present disclosure.
Figure 11D:
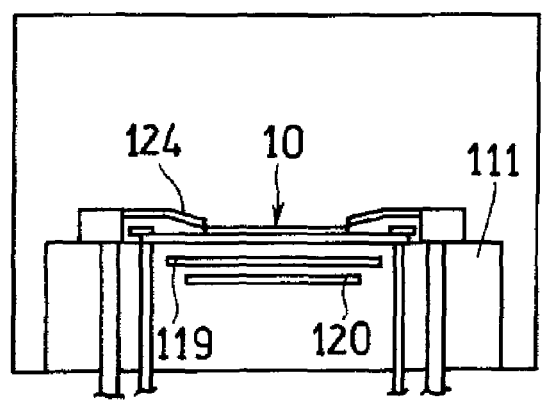
FIG. 11D is view schematically illustrating a part of the operation of the plasma treatment unit according to the embodiment of the present disclosure.

In the plasma treatment process (S2), first, support portions 122 begin to be lowered. Upper end surfaces 122a of support portions 122 are lowered to lower than or equal to the same level as stage 111, and substrate carrier 10 is placed on stage 111 (FIG. 11C). Next, lifting rod 121 is driven by lifting mechanism 123B. Lifting rod 121 lowers cover 124 to a predetermined position (FIG. 11D).

At this time, stage 111 is cooled to approximately 15° C. using a constantly circulating refrigerant in refrigerant channel 127. A voltage is applied to ESC electrode 119. The bleed-out from holding sheet 3 is likely to be significant by an electric field formed by the ESC electrode and a leakage current formed by the ESC electrode. However, since the removal process is performed after the plasma treatment process, the efficiency of the plasma treatment is not substantially lowered by the above-described bleed-out.

When cover 124 is disposed in a predetermined lowered position, portions of frame 2 and holding sheet 3 which do not hold substrate 1 are covered by cover 124 without coming into contact with cover 124 and substrate 1 is exposed from window portion 124W of cover 124.

Cover 124 has a donut shape with an approximately circular outer contour and also has a constant width and a small thickness. The inner diameter of cover 124 (diameter of window portion 124W) is smaller than the inner diameter of frame 2 and the outer diameter of cover 124 is larger than the outer diameter of frame 2. Therefore, when substrate carrier 10 is mounted on a predetermined position of the stage and lowers cover 124, cover 124 can cover at least a part of frame 2 and holding sheet 3. At least a part of substrate 1 is exposed from window portion 124W. At this time, cover 124 is not in contact with frame 2, holding sheet 3, and substrate 1. Cover 124 is formed of a dielectric such as ceramics (for example, alumina or aluminum nitride) or quartz; or a metal such as aluminum or aluminum whose surface is alumite-treated.

When support portions 122 and cover 124 are disposed in a predetermined position, process gas is introduced into the inside of reaction chamber 103 by passing through gas introduction port 103a from process gas source 112. Pressure reducing mechanism 114 exhausts gas in the inside of reaction chamber 103 from exhaust port 103b so that a predetermined pressure is maintained in reaction chamber 103.

Figure 11E:
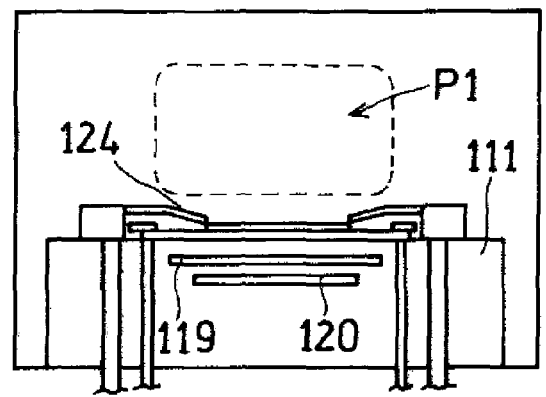
FIG. 11E is view schematically illustrating a part of the operation of the plasma treatment unit according to the embodiment of the present disclosure.

Next, high-frequency voltage is supplied to antenna 109 from first high-frequency power source 110A to generate plasma P1 in the inside of reaction chamber 103 (FIG. 11E). Generated plasma P1 is formed of ions, electrons, and radicals. The area from the surface to the rear surface of the portion exposed from the resist mask formed on substrate 1 is removed (etched) by a physicochemical reaction with generated plasma P1, and then substrate 1 is singulated.

Here, for example, a high-frequency voltage of 100 kHz or greater may be supplied to high-frequency electrode 120 from second high-frequency power source 110B. The energy incident on substrate 1 of ions can be controlled using high-frequency voltage applied to high-frequency electrode 120 from second high-frequency power source 110B. When high-frequency voltage is supplied to high-frequency electrode 120, a bias voltage is generated on the surface of stage 111, ions incident on substrate 1 are accelerated by the bias voltage, and the etching rate is increased. When high-frequency voltage is supplied to high-frequency electrode 120, bleed-out from holding sheet 3 formed of a resin is likely to be more significant. However, since bleed-out components adhered to stage 111 are removed by the removal process after the plasma treatment process, accumulation of the bleed-out components on stage 111 is suppressed even in a case where the plasma treatment is repeatedly performed while high-frequency voltage is supplied to high-frequency electrode 120. Accordingly, even in a case where the plasma treatment that supplies high-frequency voltage to high-frequency electrode 120 is repeatedly performed in order to perform etching at a high speed, the effect for cooling substrate 1 is unlikely to be damaged and generation of problems (for example, a decrease in plasma dicing speed) caused by an increase in temperature of the substrate is suppressed.

The conditions of etching are set according to the material or the like of substrate 1. For example, in a case where substrate 1 is made of Si, substrate 1 is etched by generating plasma P1 of fluorine-containing gas such as sulfur hexafluoride ($SF_6$) in reaction chamber 103. In this case, for example, the pressure of reaction chamber 103 is controlled to be in a range of 10 Pa to 50 Pa by pressure reducing mechanism 114 while supplying 100 sccm to 800 sccm of $SF_6$ gas from process gas source 112. 1000 W to 5000 W of high-frequency power at a frequency of 13.56 MHz is supplied to antenna 109 and 50 W to 1000 W of high-frequency power at a frequency of 13.56 MHz is supplied to high-frequency electrode 120.

For the purpose of suppressing an increase in temperature of substrate carrier 10 during etching, it is preferable that the temperature of the refrigerant circulated in stage 111 by refrigerant circulating device 125 is set to be 20° C. from −20° C. In this manner, the temperature of holding sheet 3 during the plasma treatment is controlled to 150° C. or lower. Therefore, thermal damage to holding sheet 3 is suppressed. Moreover, when the temperature of holding sheet 3 is in a range of, for example, 50° C. to 150° C., an organic matter is likely to be bled out from holding sheet 3.

In a case of plasma dicing, it is desired that the surface of substrate 1 exposed from the resist mask is vertically etched. In this case, an etching step using plasma, for example, fluorine-based gas such as $SF_6$ and a protective film deposition step using plasma fluorocarbon gas such as perfluorocyclobutane ($C_4F_8$) may be alternately repeated as described above.

The substrate is singulated by etching and electronic component 4 (chip) is manufactured. Next, ashing is performed. Process gas for ashing (for example, oxygen gas or mixed gas of oxygen gas and gas containing fluorine) is introduced into reaction chamber 103 from ashing gas source 113. Pressure reducing mechanism 114 evacuates reaction chamber 103 so that the pressure therein is maintained to a predetermined pressure. Oxygen plasma is generated in reaction chamber 103 by supplying high-frequency voltage from first high-frequency power source 110A, and the resist mask on the surface of electronic component 4 exposed from window portion 124W of cover 124 is completely removed.

When the ashing is finished, the gas in reaction chamber 103 is discharged and the gate valve is open. Substrate carrier 10 holding electronic component 4 is carried out from plasma treatment unit 100 by conveyance mechanism 203 that has entered from the gate valve (S3). When substrate carrier 10 is carried out, the gate valve is promptly closed. After carried-out substrate carrier 10 is temporarily carried into preparation unit 200 and inspection or the like is performed thereon as needed, substrate carrier 10 is carried into cassette unit 300 and stored in cassette 301.

Figure 12A:
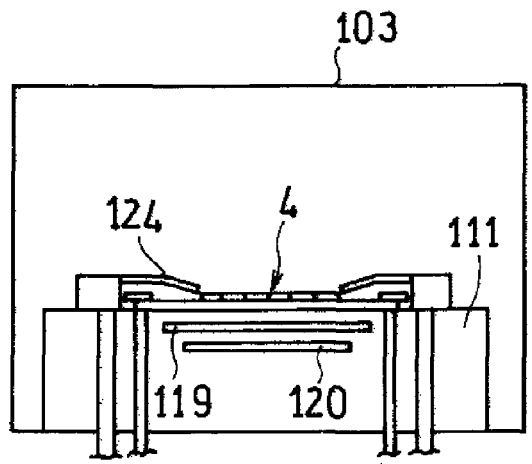
FIG. 12A is a view schematically illustrating another part of the operation of the plasma treatment unit according to the embodiment of the present disclosure.
Figure 12B:
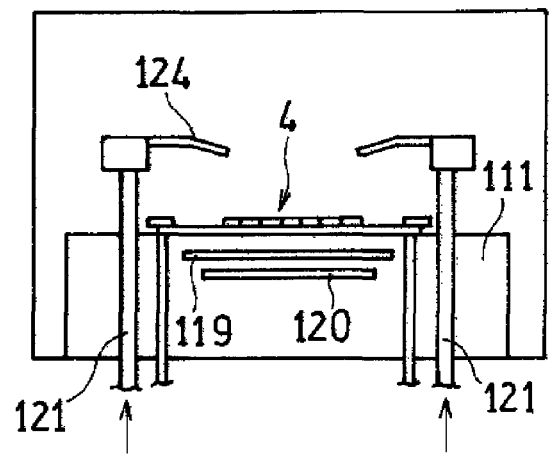
FIG. 12B is a view schematically illustrating another part of the operation of the plasma treatment unit according to the embodiment of the present disclosure.
Figure 12C:
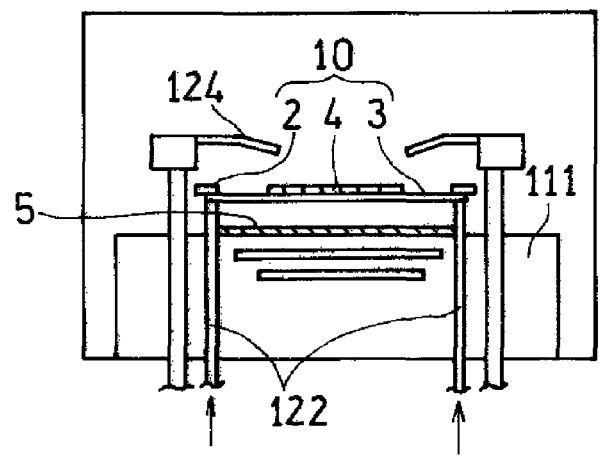
FIG. 12C is a view schematically illustrating another part of the operation of the plasma treatment unit according to the embodiment of the present disclosure.
Figure 12D:
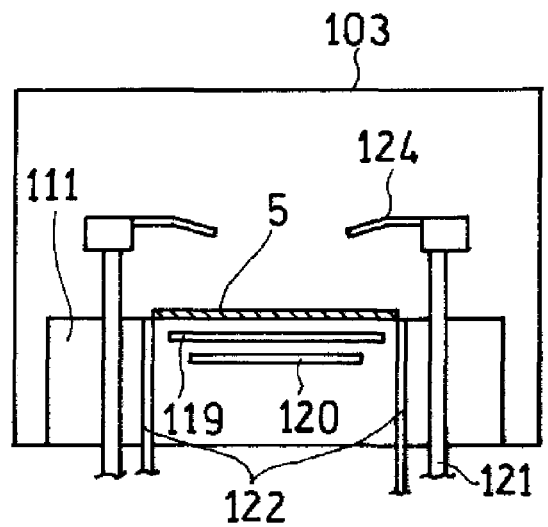
FIG. 12D is a view schematically illustrating another part of the operation of the plasma treatment unit according to the embodiment of the present disclosure.

Here, the carrying-out process of substrate carrier 10 may be performed in a reverse procedure to the procedure of mounting substrate 1 on state 111 as described above. That is, as illustrated in FIGS. 12B to 12D, after cover 124 is elevated to a predetermined position (FIG. 12B), the voltage applied to ESC electrode 119 is set to zero, adsorption of substrate carrier 10 by stage 111 is released, and support portions 122 are elevated (FIG. 12C). After support portions 122 are elevated to a predetermined position, substrate carrier 10 is carried out by conveyance mechanism 203 (FIG. 12D). FIGS. 12A to 12D are views schematically illustrating another part of the operation of the plasma treatment unit.

Figure 13:
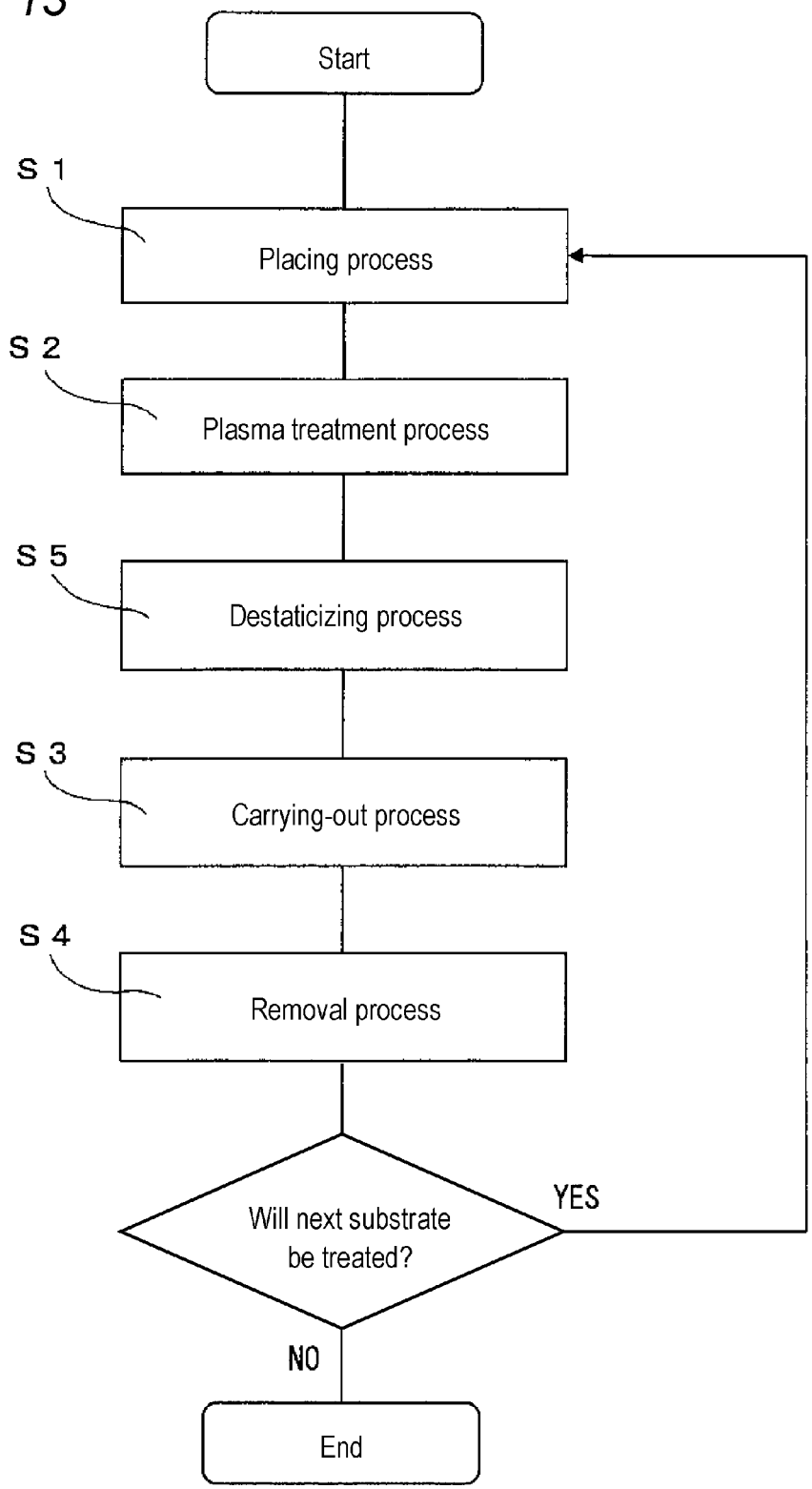
FIG. 13 is a flowchart showing a plasma treatment method according to another embodiment of the present disclosure.

Here, it is preferable to provide a destaticizing process (S5) of destaticizing holding sheet 3 before or during elevation of support portions 122 (for example, between FIG. 12B and FIG. 12C) as illustrated in FIG. 13 because it is difficult to smoothly peel holding sheet 3 off from stage 111 in a case where a charge at the time of the plasma treatment remains in holding sheet 3 and the remaining charge of holding sheet 3 is adsorbed by stage 111. The destaticization may be performed by, for example, supplying a weak high-frequency power of approximately 200 W from first high-frequency power source 110A and generating weak plasma. Holding sheet 3 formed of a resin is smoothly peeled off from stage 111 due to the destaticization and thus problems such as damage to holding sheet 3 at the time of carrying holding sheet 3 out are suppressed and the efficiency of the plasma treatment is further improved. FIG. 13 is a flowchart showing another plasma treatment method.

It is preferable that the destaticizing process (S5) is performed in the same atmosphere as that for the removal process (S4) which is continuously performed after the destaticizing process because the time required for the environment in reaction chamber 103 (that is, the atmosphere in reaction chamber 103 during the removal process) becomes suitable for the removal process and the efficiency of the plasma treatment is further improved. In a case where the removal process is performed in an oxygen atmosphere, it is preferable that the destaticizing process is also performed in the oxygen atmosphere. That is, as gas for generating plasma, it is preferable to use gas containing oxygen for destaticization and particularly preferable to use only oxygen for destaticization. In other words, the content of oxygen in reaction chamber 103 in the destaticizing process is preferably in a range of 80% by volume to 100% by volume.

In the removal process, the pressure of reaction chamber 103 is controlled to be in a range of 8 Pa to 12 Pa using pressure reducing mechanism 114 while supplying 200 sccm to 500 sccm of $O_2$ gas from ashing gas source 113. Next, the removal process is performed by supplying 100 W to 200 W of high-frequency power at a frequency of 13.56 MHz to antenna 109.

The cooling process of cooling cover 124 by introducing gas for cooling into reaction chamber 103 may be provided during a time period from when the ashing is finished (FIG. 12A) to when support portions 122 are elevated because the temperature of cover 124 becomes high when cover 124 is exposed to plasma during the plasma treatment process. When cover 124 is cooled, thermal damage to holding sheets 3 due to radiant heat from cover 124 can be more easily suppressed. From the viewpoint of suppressing thermal damage to holding sheets 3, it is preferable that the above-described cooling process is performed after cover 124 is elevated to a predetermined position and cover 124 is moved away from holding sheets 3 (FIG. 12B).

It is preferable that the cooling process is performed in the same atmosphere as that for the removal process (S4) which is continuously performed after the cooling process because the time required for the environment in reaction chamber 103 becomes suitable for the removal process and the efficiency of the plasma treatment is further improved. In a case where the removal process is performed in an oxygen atmosphere, it is preferable that the cooling process is also performed in the oxygen atmosphere. That is, as gas for cooling, it is preferable to use gas containing oxygen and particularly preferable to use only oxygen. In other words, the content of oxygen in reaction chamber 103 in the cooling process is preferably in a range of 80% by volume to 100% by volume.

Figure 12E:
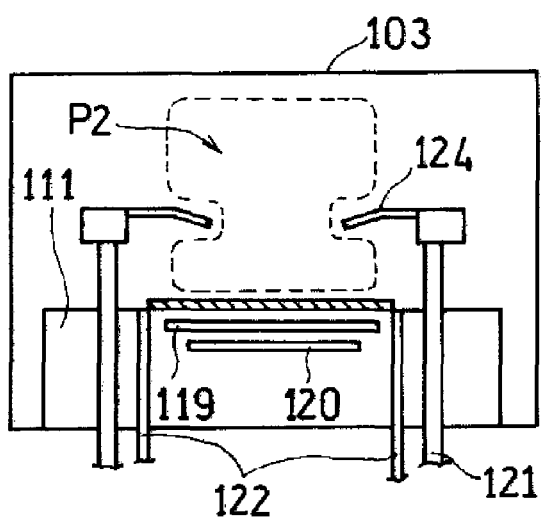
FIG. 12E is a view schematically illustrating another part of the operation of the plasma treatment unit according to the embodiment of the present disclosure.

After the destaticizing process (S5) and/or the cooling process is performed as needed, substrate carrier 10 is carried out (S3). At this time, adhesive matter 5 derived from holding sheet 3 is adhered to the surface of stage 111 (FIG. 12D). After substrate carrier 10 is carried out and the gate valve is closed, gas is supplied to reaction chamber 103 again to generate plasma P2 (FIG. 12E, S4). At this time, the pressure of reaction chamber 103 is controlled to be in a range of 8 Pa to 12 Pa using pressure reducing mechanism 114 while supplying 200 sccm to 1000 sccm of $O_2$ gas from ashing gas source 113. Next, 500 W to 1000 W of high-frequency power at a frequency of 13.56 MHz is supplied to antenna 109.

Figure 12F:
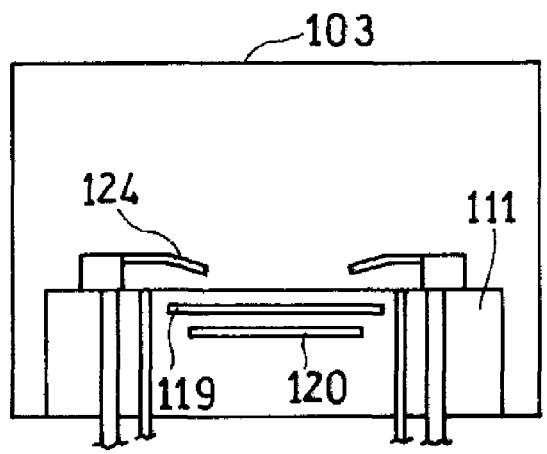
FIG. 12F is a view schematically illustrating another part of the operation of the plasma treatment unit according to the embodiment of the present disclosure.

In this manner, adhesive matter 5 bled out from holding sheet 3 and adhered to the surface of stage 111 is removed (FIG. 12F). It is preferable that adhesive matter 5 is removed by oxygen plasma as described above. After adhesive matter 5 adhered to stage 111 is removed, gas in the inside of plasma treatment unit 100 is discharged and plasma treatment unit 100 enters a vacuum state again. In this manner, a series of processes are finished. In a case where the plasma treatment is continuously performed on a plurality of substrate carriers, the processes from the placing treatment (S1) to the removal process (S4) may be repeated or the removal process (S4) may be performed after the processes from the placing process (S1) to the carrying-out process are repeated plural times.

While a series of plasma treatments are performed, next substrate 1, on which the plasma treatment is to be performed, is prepared in a portion other than plasma treatment unit 100. That is, in the process of manufacturing electronic component 4, support portions 122 and cover 124 are elevated again (FIG. 11A) after the removal process, another substrate carrier 10 is conveyed, and the placing process, the plasma treatment process, the carrying-out process, and the removal process are performed.

The plasma treatment method of the present disclosure is useful in a case where a plasma treatment is performed using a plasma treatment device including a cover over a stage.

The plasma treatment method of the present disclosure is useful as a method of performing a plasma treatment on a substrate held by a resin sheet.

What is claimed is:

1. A plasma treatment method which places a substrate held by a substrate carrier that includes a holding sheet and a frame disposed on an outer peripheral portion of the holding sheet, on a stage provided in an inside of a reaction chamber, and covers the frame with a cover that is disposed over the stage and includes a window portion for exposing the substrate, to perform a plasma treatment on the substrate, the method comprising:
   placing the substrate carrier holding the substrate on the stage;
   adjusting a distance between the cover and the stage to a first distance in which the cover covers the frame without coming into contact with the substrate carrier;
   performing the plasma treatment on the substrate placed on the stage after the adjusting of the distance;
   carrying the substrate together with the substrate carrier out from the reaction chamber after the performing of the plasma treatment; and
   removing an adhered substance adhered to the cover by generating plasma in the inside of the reaction chamber after the carrying of the substrate,
   wherein the distance between the cover and the stage in the removing of the adhered substance is a second distance greater than the first distance.

2. The plasma treatment method of claim 1, wherein the second distance is 2 mm or greater.

3. The plasma treatment method of claim 1, wherein the second distance is changed in the removing of the adhered substance.

4. The plasma treatment method of claim 1, wherein the cover is cooled in the performing of the plasma treatment.

5. The plasma treatment method of claim 1, wherein the cover is not cooled in the removing of the adhered substance.

6. The plasma treatment method of claim 1,
   wherein a cooling unit is provided in the stage, and
   the cover is cooled by bringing a part of the cover into contact with the stage.

7. A method of manufacturing an electronic component which places a substrate held by a substrate carrier that includes a holding sheet and a frame disposed on an outer peripheral portion of the holding sheet, on a stage provided in an inside of a reaction chamber, and covers the frame with a cover that is disposed over the stage and includes a window portion for exposing the substrate, to perform a plasma treatment on the substrate, the method comprising:
   preparing the substrate held by the substrate carrier that includes the holding sheet and the frame disposed on the outer peripheral portion of the holding sheet;
   placing the substrate carrier holding the substrate on the stage;
   adjusting a distance between the cover and the stage to a first distance in which the cover covers the frame without coming into contact with the substrate carrier;
   singulating the substrate by performing the plasma treatment on the substrate placed on the stage after the adjusting of the distance;
   carrying the singulated substrate together with the substrate carrier out from the reaction chamber after the dicing; and
   removing a substance adhered to the cover by generating plasma in the inside of the reaction chamber after the carrying of the substrate,
   wherein the distance between the cover and the stage in the removing of the adhered substance is a second distance greater than the first distance.

8. A plasma treatment method in which a plasma treatment is performed by placing a substrate held by a resin sheet on a stage provided in an inside of a reaction chamber, the method comprising:
   placing the substrate on the stage such that a surface of the stage comes into contact with the resin sheet;
   performing the plasma treatment on the substrate placed on the stage;
   carrying the substrate together with the resin sheet out from the reaction chamber after the performing of the plasma treatment; and
   removing a substance discharged from the resin sheet and adhered to the surface of the stage by generating plasma in the reaction chamber after the carrying of the substrate.

9. The plasma treatment method of claim 8,
   wherein a sequence of the placing of the substrate, the performing of the plasma treatment, and the carrying of the substrate is performed on each of a plurality of the substrates respectively held by a plurality of the resin sheets, and the removing of the substance is performed after the carrying of the substrate in an N-th sequence (N represents an integer) and before the placing of the substrate in an (N+1)-th sequence.

10. The plasma treatment method of claim 8, wherein the removing of the substance is performed in an oxygen atmosphere.

11. The plasma treatment method of claim 10, wherein gas including oxygen is supplied to the inside of the reaction chamber during a time period after the performing of the plasma treatment and before initiation of the removing of the substance.

12. The plasma treatment method of claim 11, wherein only oxygen is supplied to the inside of the reaction chamber during a time period after the performing of the plasma treatment and before initiation of the removing of the substance.

13. The plasma treatment method of claim 8, wherein a high-frequency voltage of 100 kHz or greater is applied to the stage in the performing of the plasma treatment.

14. The plasma treatment method of claim 8, wherein a temperature of the resin sheet is controlled to 150° C. or less in the performing of the plasma treatment.

15. The plasma treatment method of claim 10, further comprising:
destaticizing the resin sheet during a time period after the performing of the plasma treatment and before the carrying of the substrate,
wherein the destaticizing of the resin sheet is performed in an oxygen atmosphere.

16. The plasma treatment method of claim 8, wherein the substance discharged from the resin sheet includes an organic matter.

* * * * *